United States Patent [19]

De Vries et al.

[11] Patent Number: 5,736,848
[45] Date of Patent: Apr. 7, 1998

[54] ANALOG-TO-DIGITAL MEASUREMENT AND CALIBRATION SYSTEM FOR ELECTRICAL ENERGY

[75] Inventors: Jacob De Vries, Allenwinden; Jan Petr, Oberwil/Zug; Raul Cermeno, Cham; Peter Hodel, Zug, all of Switzerland

[73] Assignee: Landis & Gyr Technology Innovation AG, Zug, Switzerland

[21] Appl. No.: 520,480

[22] Filed: Aug. 29, 1995

[30] Foreign Application Priority Data

Sep. 5, 1994 [CH] Switzerland .............. 02 698/94

[51] Int. Cl.$^6$ ........................................ G01R 21/06
[52] U.S. Cl. .................. 324/142; 324/74; 364/483
[58] Field of Search ........................ 324/148, 142, 324/141, 132, 103 R, 74; 364/483, 592, 572, 481, 571.01; 341/143, 127, 145, 175, 61

[56] References Cited

U.S. PATENT DOCUMENTS

| | | | |
|---|---|---|---|
| 4,055,804 | 10/1977 | Mayfield | 324/142 |
| 4,504,787 | 3/1985 | Planer | 324/142 |
| 4,839,819 | 6/1989 | Begin et al. | 324/142 |
| 4,951,052 | 8/1990 | Jacob et al. | 341/143 |
| 5,117,180 | 5/1992 | Swerlein | 324/132 |
| 5,179,380 | 1/1993 | White | 341/143 |
| 5,245,343 | 9/1993 | Greenwood et al. | 341/143 |
| 5,301,121 | 4/1994 | Garverick et al. | 364/483 |
| 5,323,157 | 6/1994 | Ledzius et al. | 341/143 |
| 5,345,236 | 9/1994 | Sramek, Jr. | 341/143 |
| 5,345,400 | 9/1994 | McGrath et al. | 364/483 |
| 5,485,393 | 1/1996 | Bradford | 324/142 |
| 5,493,212 | 2/1996 | Gervais et al. | 324/142 |

FOREIGN PATENT DOCUMENTS

| | | |
|---|---|---|
| 0 607 711 A1 | 7/1994 | European Pat. Off. |
| WO8603302 | 6/1986 | WIPO |

*Primary Examiner*—Vinh P. Nguyen
*Attorney, Agent, or Firm*—Meltzer, Lippe, Goldstein, Wolf, & Schlissel, P.C.

[57] ABSTRACT

A system for measuring the energy output from one or more electrical energy sources first makes an analog power measurement, and converts the resultant output into digital form. The A/D converter includes a sigma-delta modulator in series with a digital filter. Then, the output from the A/D converter is inputted to a digital quantizer via a serial interface. A programmable calibration value is also inputted into the digital quantizer from a computer via a non-volatile memory, such that the operating level/calibration of the digital quantizer is controllable by the computer.

27 Claims, 9 Drawing Sheets

ANALOG-TO-DIGITAL MEASUREMENT AND CALIBRATION SYSTEM FOR ELECTRICAL ENERGY

RELATED APPLICATION

This invention is related to pending and allowed U.S. patent application Ser. No. 08/639,687, entitled "SC-Integrator with Switchable Polarity," filed on Apr. 29, 1996 (still pending).

BACKGROUND OF THE INVENTION

The invention relates to an arrangement to measure electrical energy, more particularly, the present invention relates to analog and digital circuits that measure electrical energy.

The arrangement according to the invention is preferably used in single-phase or multiphase electricity meters used to measure one or several types of energy such as, e.g., active energy and/or blind energy and/or apparent energy, whereby each type of energy may have a positive and/or negative sign. The arrangement is provided with at least one measuring system, i.e., one measuring system per phase or two measuring systems in a 3-conductor arrangement of a three-phase arrangement and/or one measuring system per measured energy type.

An arrangement of the type mentioned above is known from U.S. Pat. No. 4,504,787 describing a watt-hour meter containing a magneto-resistive bridge for the multiplication of a current by a voltage to form an output signal that is proportional to the appertaining momentary power and which is transmitted to a microcomputer to calculate an energy consumption. A calibration method is known from EP 0 569 740 A1.

It is the object of the invention to create an arrangement to measure electrical energy at low cost, with measuring systems that can be digital and the measuring time of which required for a calibration and/or control test can be reduced considerably, approximately 60 times, also these two factors resulting in great savings in test and alignment. Among other things the invention thus makes rapid digital calibration of energy-measuring arrangements possible.

SUMMARY OF THE INVENTION

An arrangement of electrical circuits is provided to measure electrical energy. The arrangement includes a circuit to determine analog power values and an analog-to-digital converter downstream of the analog power determining circuit. The analog-to-digital converter contains a sigma-delta modulator and a digital filter downstream of the sigma-delta modulator. The analog-to-digital converter is upstream to a serial interface in a special arrangement for digital quantizing. The serial interface, in turn, is connected via a bus connection to an non-volatile memory.

BRIEF DESCRIPTION OF THE DRAWINGS

Examples of embodiments of the invention are shown in the drawing and are described in further detail below.

DESCRIPTION OF THE PREFERRED EMBODIMENT

The arrangement according to the present invention to measure electrical energy is provided in all variants with at least one measuring system and has one arrangement 1 for the determination of analog power values p[t] and an analog-to-digital converter 2 downstream of the arrangement 1 (see FIGS. 2 to 5).

Figure 1:
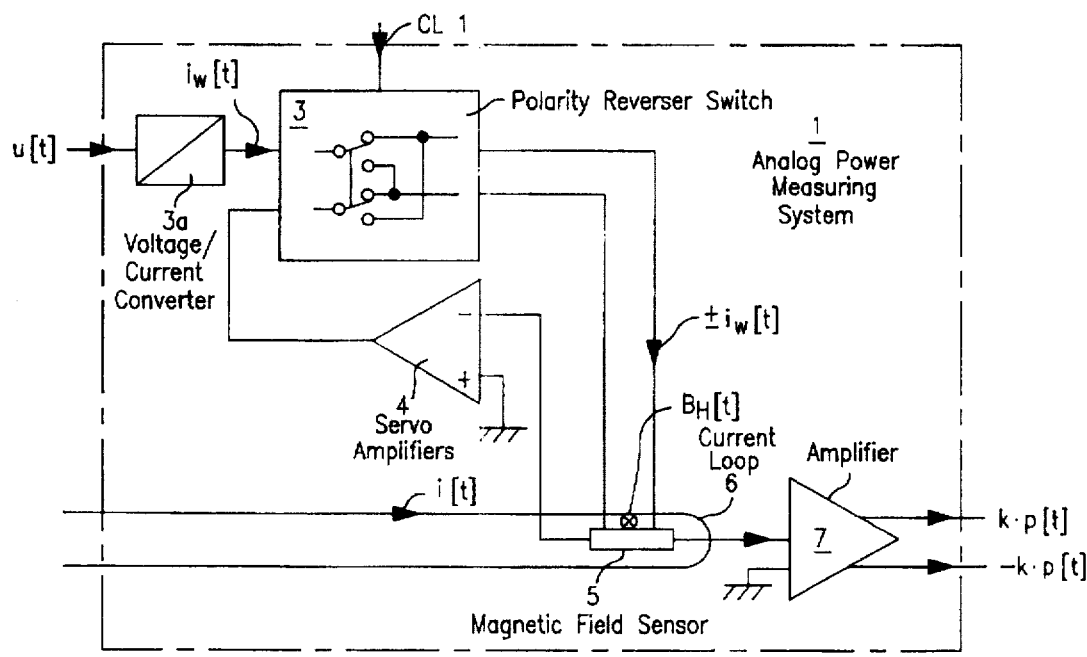
FIG. 1 is a schematic diagram of an arrangement to determine analog electrical power values.

The design of the arrangement 1 in FIG. 1 for example is a mostly known design. In this case it contains a voltage/current converter 3a, a polarity reverser switch 3, a servo-amplifier 4, a magnetic field sensor 5 located between the conductor legs of a U-shaped current loop 6 and an amplifier 7. Art alternating current i[t] flows during operation through the current loop 6 and produces a magnetic induction $B_H[t]$ which acts preferably parallel to the surface of the magnetic field sensor 5. The latter is preferably a Hall sensor. A single-pole alternating voltage u[t] associated with the alternating current i[t] and referred to a reference potential ground is supplied to an input of the voltage/current converter 3a the output of which is connected to a first connection of a two-pole input of the polarity reverser 3. The arrangement 1 thus has the alternating current i[t] and the appertaining alternating voltage u[t] as input signals. The voltage/current converter 3a transforms the alternating voltage iu[t] into a proportional feed current $i_W[t]$ and is preferably a serial resistance. The two-pole output of the polarity reverser 3 is connected to a two-polarity feed input of the magnetic field sensor 5. The magnetic field sensor 5 is therefore fed during operation with a magnetic field sensor current $i_H[t]$ the absolute value of which is equal to the feed current $i_W[t]$ and is therefore proportional to the alternating voltage u[t] and whose polarity is periodically switched over in time with a low-frequency clocking signal CL1 by means of the polarity reverser 3. Thus $i_H[t]=\pm i_W[t]$. The polarity reverser 3 consists, e.g., of a two-polarity commutator in the form of a polarity reverser 3 and whose control input constitutes an clocking input of the arrangement 1 fed the clocking signal CL1 whose frequency may be, e.g., $2^5$ Hz. The two-pole commutator (i.e., switch) is preferably made in accordance with CMOS technology and consists of four on/off switches called "transmission gates" which are operated by means of two inverters two by two in push-pull action and thus constitute two single-pole commutators (i.e., switch) which are commutated synchronously. The periodic commutation of the feed current $i_W[t]$ is used to eliminate the offset voltage of the arrangement 1 as shall be explained further below. A first connection of a two-pole output of the magnetic field sensor 5 is connected, e.g., to a first input of the amplifier 7 which has a two-pole push-pull output which is at the same time an output of the arrangement 1. A second input of the amplifier 7 may be connected to ground, for example. The voltage of a second connection of the two-pole of the magnetic field sensor 5 is regulated to zero by means of the servo-amplifier 4, so that this second connection is practically connected to ground in operation. For this purpose the second connection of the two-pole output of the magnetic field sensor 5 is connected to an inverting input of the servo-amplifier 4 whose non-inverting input is connected to ground and whose output is connected to a second connection of the two-pole input of the pole reverser 3. The magnetic field sensor 5 constitutes the product of the magnetic induction $B_H[t]$ and of the feed current $i_W[t]$ and thereby the product of the alternating current $i[t]$ and of the appertaining alternating voltage $u[t]$, so that its output signal is proportional to the power values $p[t]=u[t]*i[t]$. The two output signals of the amplifier 7 and thereby the arrangement 1 are then also proportional to power and equal to $+k*p[t]$ or $-k*p[t]$, where k represents a proportionality constant.

Figure 2:
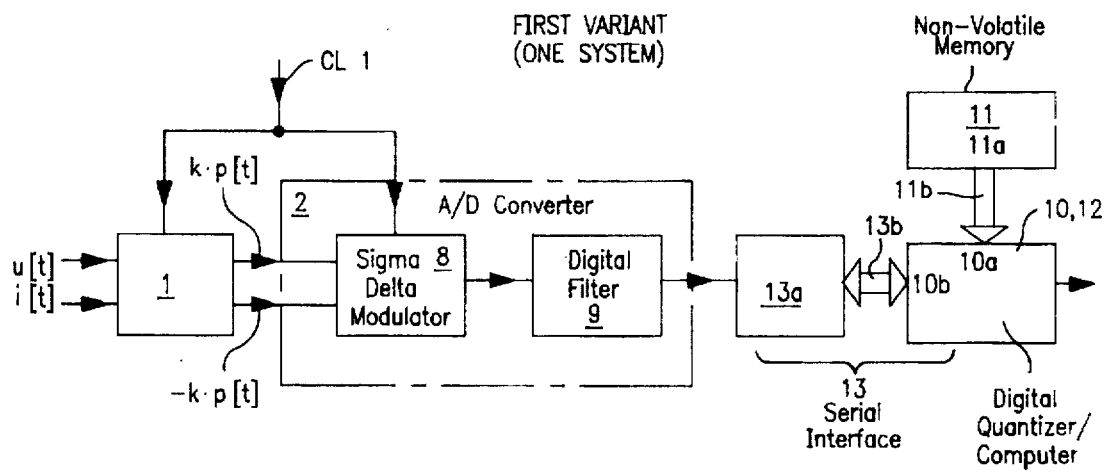
FIG. 2 is a schematic diagram of a first variant of an arrangement according to the present invention, with one single measuring system.
Figure 4:
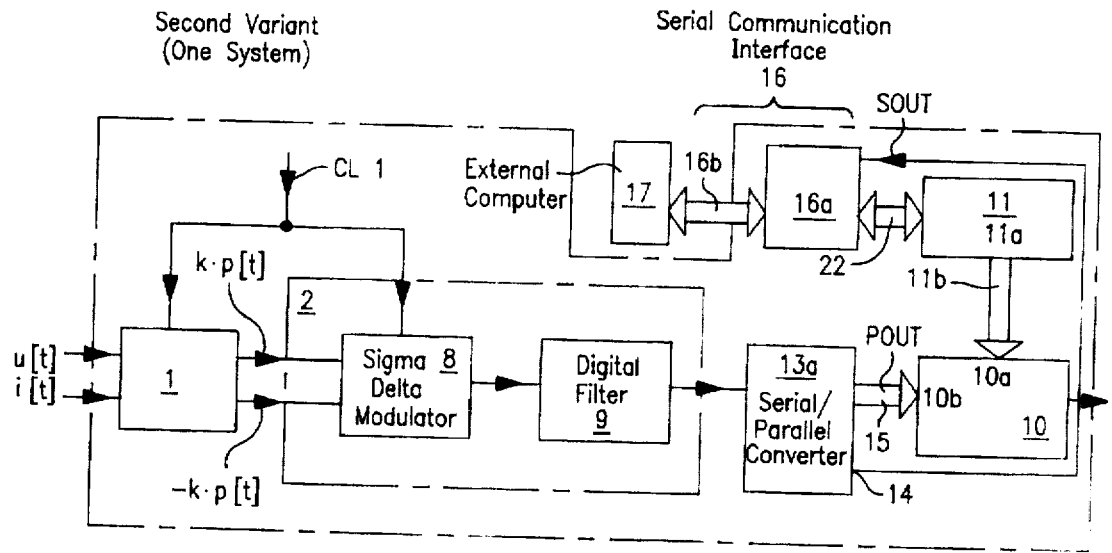
FIG. 4 is a schematic diagram of a second variant of an arrangement according to the present invention with one single measuring system.

The analog-to-digital converter 2 contains a sigma-delta modulator 8 as well as a digital filter 9 downstream of the latter (see FIGS. 2 and 4). The two-pole output of the arrangement 1 is connected to a two-pole input of the sigma-delta modulator 8 with a switching input fed the same clocking signal CL1 as the clocking input of the arrangement 1. The sigma-delta modulator 8 contains a polarity reverser (PR in block 8 of FIG. 4) which is commutated periodically by means of the clocking signal CL1 in synchronism with the polarity reverser 3 of the arrangement 1 (FIG. 4) in order to realize polarity commutations. As a consequence, the desired signal is twice polarity-reversed synchronously, once in the arrangement 1 and once in the sigma-delta modulator 8, so that the final effect is that the desired signal reaches the input of the digital filter 9 without polarity reversal. The polarity of the offset voltage of the arrangement 1 on the other hand is periodically polarity-reversed only once, i.e., in the sigma-delta modulator 8. When mean values are steadily produced for the half waves in the digital filter 9, the offset voltage and its fluctuation, and therefore also its contribution to the output signals of the digital filter 9 is completely eliminated when the commutation frequency of the polarity converters, i.e., the frequency of the clocking signal CL1, e.g., $2^5$ Hz is an integral multiple of a sampling frequency of the digital filter 9, e.g., 4 Hz which exists at the output of the digital filter 9.

The analog-to-digital converter 2 is followed by an arrangement 10 for digital quantizing. The power proportional output signals $\pm k*p[t]$ of the arrangement 1 are converted by means of the sigma-delta modulator 8 into a rapid 1-bit digital signal which is in turn decimated in the digital filter 9 into a slower multi-bit digital signal with simultaneous elimination of existing unwanted signals, e.g., a modulation of the performance-proportional output signals by periodic fluctuations of the momentary power (double network frequency) by periodic polarity commutations ($2^5$ Hz) of the offset voltage and through an ohmic zero component of the Hall element (network frequency). Since the digital filter 9 operates synchronously with the polarity commutation of the offset voltage, the suppression of modulation of the offset voltage is almost ideal, and any offset voltage control is superfluous. The frequency of the rapid 1-bit digital signal is, e.g., $2^{17}$ Hz and that of the slower multi-bit digital signal at the output of the digital filter 9, as already mentioned, e.g., 4 Hz. The digital multibit output values of the digital filter 9 which are available at an integration cycle which is then 4 Hz are respectively proportional to the mean value of the measured momentary power which is determined over one integration period. The application of the switched capacitor technology enables the sigma-delta modulator 8 to use a high cycle frequency, i.e., a cycle signal CLK of frequency $2^{17}$ Hz feeds its cycle input. This has the advantage that a wanted resolution of, e.g., 22 bits of the analog-to-digital converter 2 within a very short time, e.g., within 0.5 seconds can be achieved. This high resolution is achieved on the one hand due to the relatively high sampling rate and on the other hand due to the utilization of a $Sinc^2$ filter as digital filter 9 instead of a sinc filter. The capacities of all capacitors of the sigma-delta modulator 8 can furthermore be selected to be so small that they can all be realized internally in a chip. The sigma-delta modulator 8 in the switched capacitor technology therefore requires no external capacitors.

At the output of the digital filter 9 and thereby of the analog-to-digital converter 2 digitalized values of the power signals $\pm k*p[t]$ are present, these values being called hereinafter digital power values for short and having, e.g., 22 bits in resolution. These digital power values are then quantized in the arrangement 10, i.e., they are added up (accumulated) continuously and are broken down into constant quantums. Each time when the sum in the accumulator exceeds a certain value a constant number (quantum) is deducted from the sum and at the same time an output impulse is emitted at the output of the arrangement 10. These quantums can be set by the calibration value $N_K$ and always represent an equal value of the measured energy. The value of the quantums and thereby also of the transmission factor of the arrangement 10, i.e., the quantizing, can therefore be adjusted and controlled by means of the calibration value $N_K$ stored in an non-volatile memory 11. A non-volatile memory, is known to be a memory which does not lose its contents of information in case of a voltage failure. A bus output 11a of the non-volatile memory 11 is connected for this purpose via a bus connection 11b to a first bus input 10a of the arrangement 10 (see FIGS. 2 to 5). The entire arrangement according to the invention can be calibrated digitally by programming the transmission factor of the arrangement 10. The non-volatile memory 11 is preferably a field-programmable read only memory FPROM or an electrical erasable programmable read only memory EEPROM.

A first variant of an arrangement according to the invention with one single measuring system is shown in FIG. 2. In this variant, the arrangement 10 for digital quantizing is a computer 12, preferably a microcomputer, which is provided with the software that executes the digital quantizing. The non-volatile memory 11 is in this case preferably part of the computer memory. A serial output of the digital filter 9, and thereby of the analog-to-digital converter 2, is then advantageously connected in the indicated sequence via an interface logic 13a and an interface bus connection 13b to a second bus input 10b of the arrangement 10, i.e., of the computer 12. The interface logic 13a and the interface bus connection 13b together constitute a serial interface 13.

Figure 3:
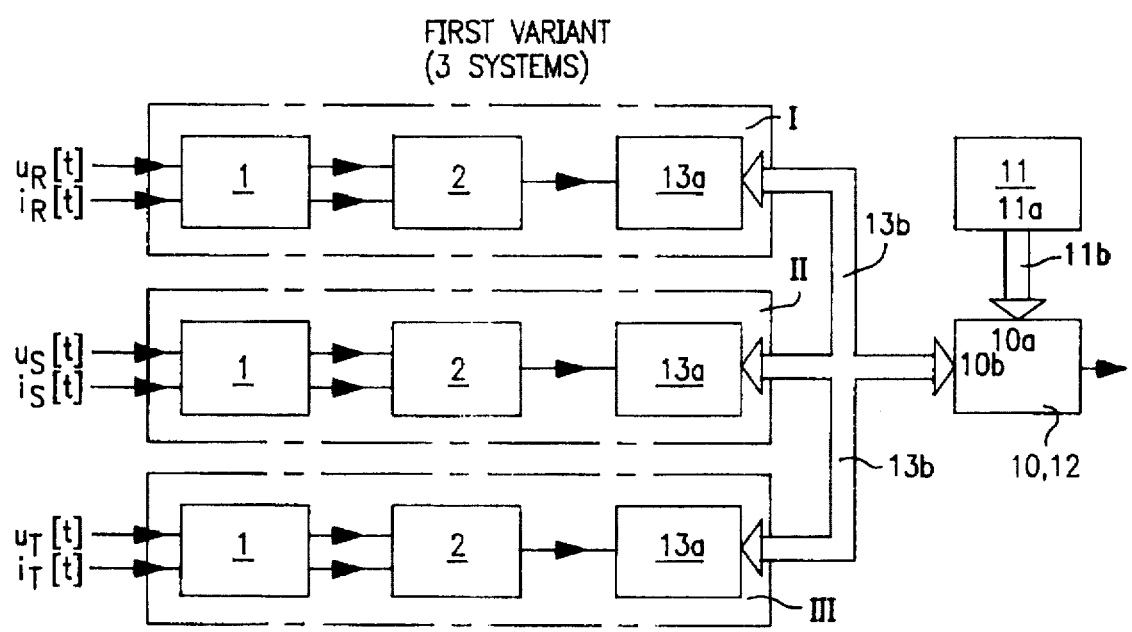
FIG. 3 is a schematic diagram of the first variant of an arrangement according to the invention with several measuring systems.

A first variant of an arrangement with several measuring systems, is shown in FIG. 3. This variant has an arrangement I or II or III per measuring system, all of identical construction. Thus several, e.g., three identically constructed arrangements I, II, and III are present, each of whose input signal is respectively an alternate current $i_R[t]$ or $i_S[t]$ or $i_T[t]$ and each of whose second input signal is respectively an alternative voltage $u_R[t]$ or $u_S[t]$ or $u_T[t]$. Each of the arrangements I to III contains in the indicated sequence a serial connection of the arrangement 1, of the analog-todigital converter 2 and of the interface logic 13a. The arrangement 10 for digital quantizing is preferably one single computer common to all measuring system, i.e., the computer 12. The outputs of the arrangements I, II, and III are then connected, each via an interface bus connection 13b, to the second bus input 10b of the common computer 12 which assumes the function of all the arrangements 10. The output of the analog-to-digital converter 2 is thus connected in each case via a serial interface 13 to the computer 12. The latter is equipped with the non-volatile memory 11 and carries out quantizing as well as calibration of all measuring systems as well as, in the case of multi-phase electricity counters, the algebraic addition of the individual phase capacities or phase energies. The algebraic addition is preferably an additive or subtractive counting of the output impulses of all the arrangements I, II, and III.

In the second variant of an arrangement according to the invention, with only one single measuring system as shown in FIG. 4, the arrangement 10 for digital quantizing is a digital hardware quantizer. The serial output of the digital filter 9 and thereby of the analog-to-digital converter 2 is in this case preferably connected to a serial input (IN) of a serial/parallel converter 14, whose parallel output is connected via a bus connection 15 to the second bus input 10b of the arrangement 10, i.e., of the digital hardware quantizer. In the second variant, the non-volatile memory 11 is preferably connected via a serial communication interface 16 consisting in the sequence indicated of a communications interface logic 16a and a communications interface bus connection 16b to an external computer 17, among other things for the loading of the calibration value $N_K$ into the non-volatile memory 11. The latter can therefore be programmed by computer 17 via the communication interface 16. The computer 17 which is preferably a minicomputer is connected for that purpose during calibration via the interface bus connection 16b to the communications interface logic 16a which is in turn connected via a bus connection 22 to a bus input of the non-volatile memory 11. The presence of the interface bus connection 16b in the second variant has the advantage, in addition to the loading or burning in of the calibration value $N_K$ into the non-volatile memory 11, that through commands transmitted from the external computer 17 via the communication interface 16 a switching to different test modes can be effected and access to various test signals is possible in order to carry out, e.g., an expanded and/or accelerated test. The serial/parallel converter 14 contains a shift register not shown in FIG. 4, the serial output of which constitutes a serial output 14a of the serial/parallel converter 14. The serial output 14a is optionally connected via communications interface logic 16a and interface bus connection to the external computer 17. This offers the advantage that the second variant can easily be converted later into a modified second variant which is similar to the first variant but in which the external computer 17 and an external non-volatile memory (not shown) take over the role of the internal computer 12, i.e., of the internal arrangement 10 and of the internal memory 11. The components 10 and 11 shown in FIG. 4 are then superfluous. The first variant, and thereby also the modified second variant, has the advantage that problems produced in multi-phase electricity counters by a jitter caused by impulse addition can be eliminated.

Figure 5:
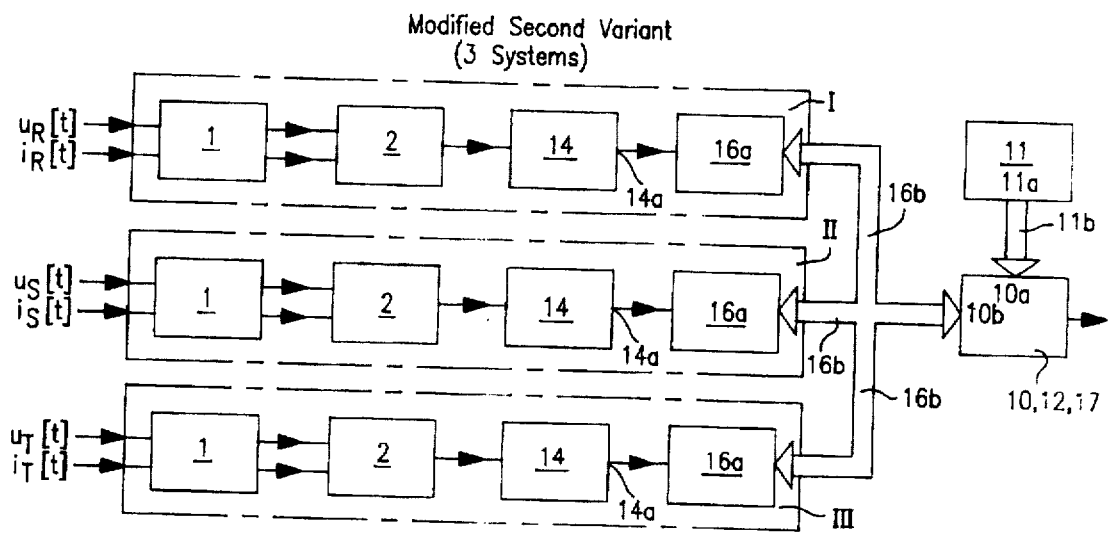
FIG. 5 is a schematic diagram of a modified second variant of an arrangement according to the present invention with several measuring systems.

A modified second variant of an arrangement with several measuring systems is shown in FIG. 5. In this variant, there are several, e.g., three arrangements I, II, and III of identical structure, just as in the first variant shown in FIG. 3. In this case however, each of the arrangements I to III contains a serial connection, in the sequence indicated, of the analog-to-digital converter 2, the serial/parallel converter 14 and, via serial output 14a, of the communications interface logic 16a. The outputs of the arrangements I, II, and III are each connected via an interface bus connection 16b to the same bus input 10b of the common computer 12 or 17 which assumes the functions of all the arrangements 10, whereby the computer is again equipped with the non-volatile memory 11 and takes over the quantizing as well as calibration of all measuring systems, and in multi-phase electricity counters, the algebraic addition of the individual phase capacities or phase energies. The output of the analog-to-digital converter 2 is thus connected in the modified second variant via the serial/parallel converter 14 and the communication interface 16 which is connected to its serial output 14a to the computer 12 or 17.

In FIGS. 3 and 5 the clocking signal CL1 with its connections is not shown in order to simplify the drawing. As can be seen in these figures, the arrangement 10, if it is a computer 12 or 17, can be installed in a central position with the non-volatile memory 11 in multi-system electricity counters. Among other things, this has the advantage that the two no longer need to be installed together with the components 1, 8, 9, and 13 or 14 in each sensor element, so that the costs of the measuring system can be drastically reduced thereby. It is a further advantage of the computer solution of arrangement 10 that the calibration value $N_K$ is stored in the electric re-programmable read only memory of the computer and can thus be changed several times, so that the electricity counter in question is newly calibrated several times.

Figure 6:
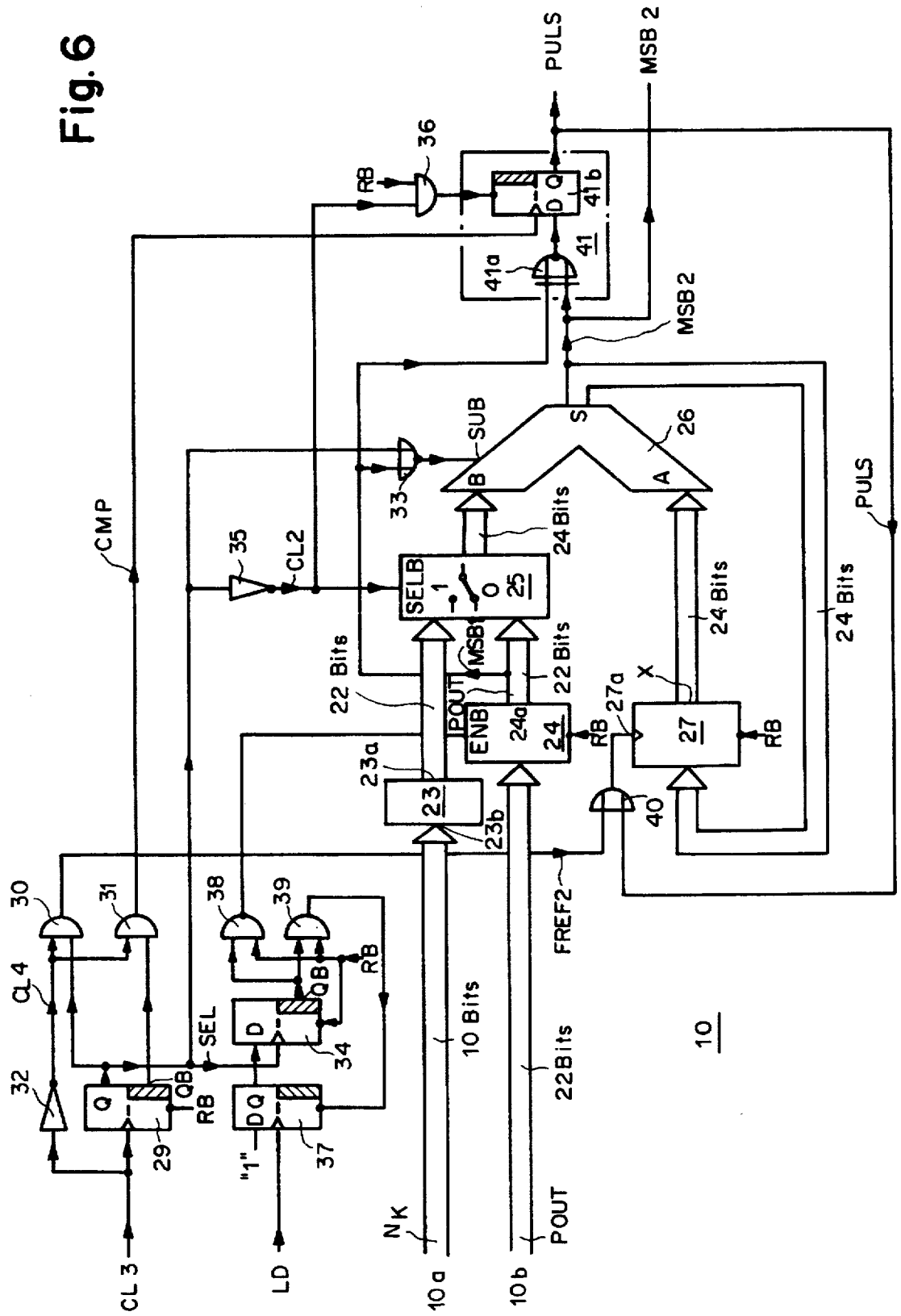
FIG. 6 is a schematic diagram of a digital quantizer.

In the second variant (see FIG. 4) the digital hardware quantizer, i.e., the arrangement 10, preferably has the structure shown in FIG. 6 and contains, among other things, a bit expansion switch 23. A bus input with, e.g., 22 bits of a first intermediate memory 24 constitutes the second bus input 10b of the digital hardware quantizer. The intermediate memory 24 has also 22 bits in that case. A multi-bit switch 25 controlled by a clocking signal CL2 is located in the hardware quantizer for periodic, alternating connection in time between a first bus input B of an algebraic adder 26 and a bus output 24a or 23a of the first intermediate memory 24 or of the bit expansion switch 23. The bus output 11a of the non-volatile memory 11 is, as mentioned earlier, connected via the bus connection 11b to the first bus input 10a of the arrangement 10 and thereby of the hardware quantizer (see FIG. 4). The bus input 10a is in turn connected via a bus connection having, e.g., 10 bits to a bus input 23b of the bit expansion switch 23 so that the 10-bit calibration value $N_K$ stored in the non-volatile memory 11 appears at the bus inputs 10a and 23b. The bus output 23a is connected via a 22-bit bus connection to the multi-bit switch 25. At the bus output 23a of the bit expansion switch 23 the value of a 22-bit calibration value $N'_K = K_A + K_B * N_K$ appears, where $K_A$ and $K_B$ are two constants. The calibration value $N_K$ is the variable portion of the calibration constant $N'_K$. In order to minimize the memory requirements for calibration, only the variable portion of $N'_K$, i.e., $N_K$ instead of the total value of $N'_K$ is stored in the non-volatile memory 11. The non-variable portion of $N'_K$ is known in the arrangement 10 and is taken into account by the bit expansion switch 23. A bus output S of the algebraic adder 26 is connected to a bus input of the second intermediate memory 27 whose bus output is connected to a second bus input A of the algebraic adder 26. The multi-bit switch 25, the algebraic adder 26 and the second intermediate memory 27 have 24 bits each. A clocking signal CL3, e.g., of frequency $2^{14}$ Hz is brought to a clocking input of a flip flop 29 in which its frequency is divided by two so that, alternating in time, a logical value "1" appears for $2^{-14}$ seconds at the Q output or at the inverting QB output of the flip flop 29 in order to enable a first enable gate 30 in the first case and a second enable gate 31 in the latter case for the clocking signal CL3 inverted in an inverter 32. For this purpose the Q output and the QB output of the flip flop 29 are respectively connected to a first input of the enable gate 30 or 31. The inverted clocking signal CL3 is subsequently designated as clocking signal CL4 and feeds a second input of each of the two enable gates 30 and 31 which may both be AND gates, for example. A signal appearing at the Q output of the flip flop 29 is designated SEL and feeds a first input of a NOR gate 33, a clocking input of a flip flop 34 and an input of the inverter 35 whose output signal is the clocking signal CL2. The latter feeds a control input SELB of the multi-bit switch 25 in order to commutate it, and a first input of an AND gate 36. A loading input LD of the hardware quantizer is connected to a clocking input of a D flip flop 37 at the D-input of which a logical value "1" appears and whose Q output is connected to a D-input of the flip flop 34 whose inverting QB output is connected to a first input of a NAND gate 38 and that of an AND gate 39. The output of the latter is connected to a reset input of the flip flop 37. The output of the NAND gate 38 is connected to an inverting load input ENB of the first intermediate memory 24. A signal appearing at the loading input LD of the hardware quantizer has, e.g., a frequency of 4 Hz and its rising flank indicates that a power value supplied by the analog-to-digital converter 2 appears at the parallel output of the serial/parallel converter 14 in the form of a digital power value POUT and causes a logical value "1" to be loaded into the flip flop 37. The Q output signal of the latter is synchronized by means of the SEL signal and the flip flop 34, so that the QB output signal of the latter enables the resetting of the D flip flop 37 via the NAND gate 38 and the loading process of the first intermediate memory 24 and via the AND gate 39 so that in the end effect the output signal of the NAND gate 38 is a loading impulse causing the digital power value POUT appearing at the bus input 10b and coming from the parallel output of the serial/parallel converter 14 to be loaded into the first intermediate memory 24. The enable gate 30 is available in the digital hardware quantizer to load the output value of the algebraic adder 26 by means of the clocking signal CL4, the output value of the algebraic adder 26 into the second intermediate memory 27 when the first bus input B of the algebraic adder 26 is connected to the bus output 24a of the first intermediate memory 24, i.e., when the Q output of the flip flop 29 has a logical value "1" and the clocking signal CL2 a logical value "0". For this purpose an output signal FREF2 of the enable gate 30 goes over an OR gate 40 and its first input to a loading input 27a of the second intermediate memory 27. In this case the intermediate memory 24, the multi-bit switch 25, the algebraic adder 26 and the intermediate memory 27 work together as accumulator 24, 25, 26, 27 in which the digital performance value POUT stored in the first intermediate memory 24 is added algebraically to the algebraic sum value X already present in the second intermediate memory 27. Since the digital power values POUT appear at constant time intervals of, e.g., $2^{-2}$ seconds at the bus input 10b and are loaded at the same constant time interval into the intermediate memory 24, the algebraic sum value X is equal to the power values accumulated in the time during which the arrangement 24, 25, 26, 27 functions as an accumulator or, if the constant time interval is 1 sec., equal to the energy accumulated during that time. In case of a time interval other than 1 second, its constant value must be taken into account in that of the calibration value $N_K$. In the time during which the first bus input B of the algebraic adder 26 is connected to the bus output 23a of the bit expansion switch 23, i.e., when the Q output signal of the flip flop 29 has a logical value "0" and the clocking signal CL2 has a logical value "1", the algebraic adder 26 is an adding element if a negative value POUT is stored in the first intermediate memory 24 and a subtracting element if it is a positive value stored therein. In the latter case the output value of the algebraic adder 26 is equal to the difference $X-N'_K$ between a value X which has just been stored in the second intermediate memory 27 and the value of the $N'_K$ appearing at the bus output 23a of the bit expansion switch 23. In order to achieve this, the output of the bus output 24a of the intermediate memory 24 at which the most significant bit MSB1 appears is connected to a second input of the NOR gate 33 whose output is connected to a commutation input SUB of the algebraic adder 26. If the output signal of the NOR gate 33 has a logical value "0", the algebraic adder 26 functions as an adding element, if this output signal has a logical value "1" the adder 26 functions as a subtracting element. In other words, if the storage value POUT of the intermediate memory 24 is positive during the mentioned time, the accumulated power value X less the value of the calibration constant $N'_K$ stored in the intermediate memory 27 appears at the output of the algebraic adder 26. If on the other hand the storage value POUT of the intermediate memory 24 is negative during that time, the accumulated power value X plus the value of the calibration constant $N'_K$ stored in the intermediate memory 27 appears at the output of the algebraic adder 26. Those outputs of the bus outputs 24a and S of the first intermediate memory 24 and of the algebraic adder 26 at which the most significant bit MSB1 or MSB2 appears are each connected to one of two inputs of a downstream impulse generator 41 for the generation of an impulse at the output of the latter if at the time during which the first bus input B of the algebraic adder 26 is connected to the bus output 23a of the bit expansion switch 23 the two most significant bits MSB1 and MSB2 are identical. Each output impulse of the impulse generator 41 represents here a certain constant quantum energy predetermined by the calibration value $N_K$. In other words: during the above-mentioned time the accumulated power value X is compared with the calibration constant $N'_K$. If the storage value POUT of the intermediate memory 24 is positive, the algebraic adder 26 constitutes the difference $X-N'_K$ and if this difference is positive, i.e., if X is positive and greater than $N'_K$, the impulse generator 41 generates an impulse of significance $N'_K$. If on the other hand the storage value POUT of the intermediate memory 24 is negative during that time, the algebraic adder 26 forms the sum $X+N'_K$ and if this sum is negative, i.e., if X is negative and in absolute value greater than $N'_K$, the impulse generator 41 also generates an impulse of significance $N'_K$. All the output impulses of the impulse generator 41 together constitute a PULS output signal of the hardware quantizer. The impulse generator 41 contains, for example, an exclusive NOR gate 41a whose two inputs constitute the two inputs of the impulse generator 41 and whose output is connected to a D input of a D-flip flop 41b. The output of the enable gate 31 is connected to a clocking input of the flip flop 41b and supplies it with a compare signal CMP. The output of the AND gate 36 is connected to a reset input of the flip flop 41b. A Q output of the flip flop 41b constitutes the output of the impulse generator 41 which is at the same time a first output of the hardware quantizer at which the output signal PULS appears during operation. The output of the impulse generator 41 is connected via the OR gate 40 and its second input to the load input 27a of the second intermediate memory 27. In other words, when an impulse appears at the output of the impulse generator 41 the storage value X of the intermediate memory 27 is replaced by the value $X-N'_K$ or $-|X|+N'_K$, i.e., its absolute value is reduced by the energy value $N'_K$ of the output impulse of the impulse generator The energy measured by the arrangement according to the invention thus consists of the sum of the output impulses of the impulse generator 41 all of which represent an energy value $N'_K$, as well as of a residual value $X-N'_K$ or $-|X|+N'_K$ which must furthermore be weighted with the value of the calibration constant $N'_K$ and is taken into account only in the next impulse appearing at the output of the impulse generator 41. The output of the bus output S of the algebraic adder 26, at which the most significant bit MSB2 appears, constitutes a second output of the hardware quantizer at which a logical value "1" appears when the impulse appearing at that moment at the first output of the hardware quantizer represents a negative energy and a logical value "0" appears if the impulse represents a positive energy. A reset signal RB (i.e., an inverted reset) feeds the second inputs of the gates 36, 38, and 39 as well as the reset inputs of the flip flops 29 and 34 as well as of the intermediate memories 24 and 27 for general resetting of the hardware quantizer to zero when this is required.

Figure 7:
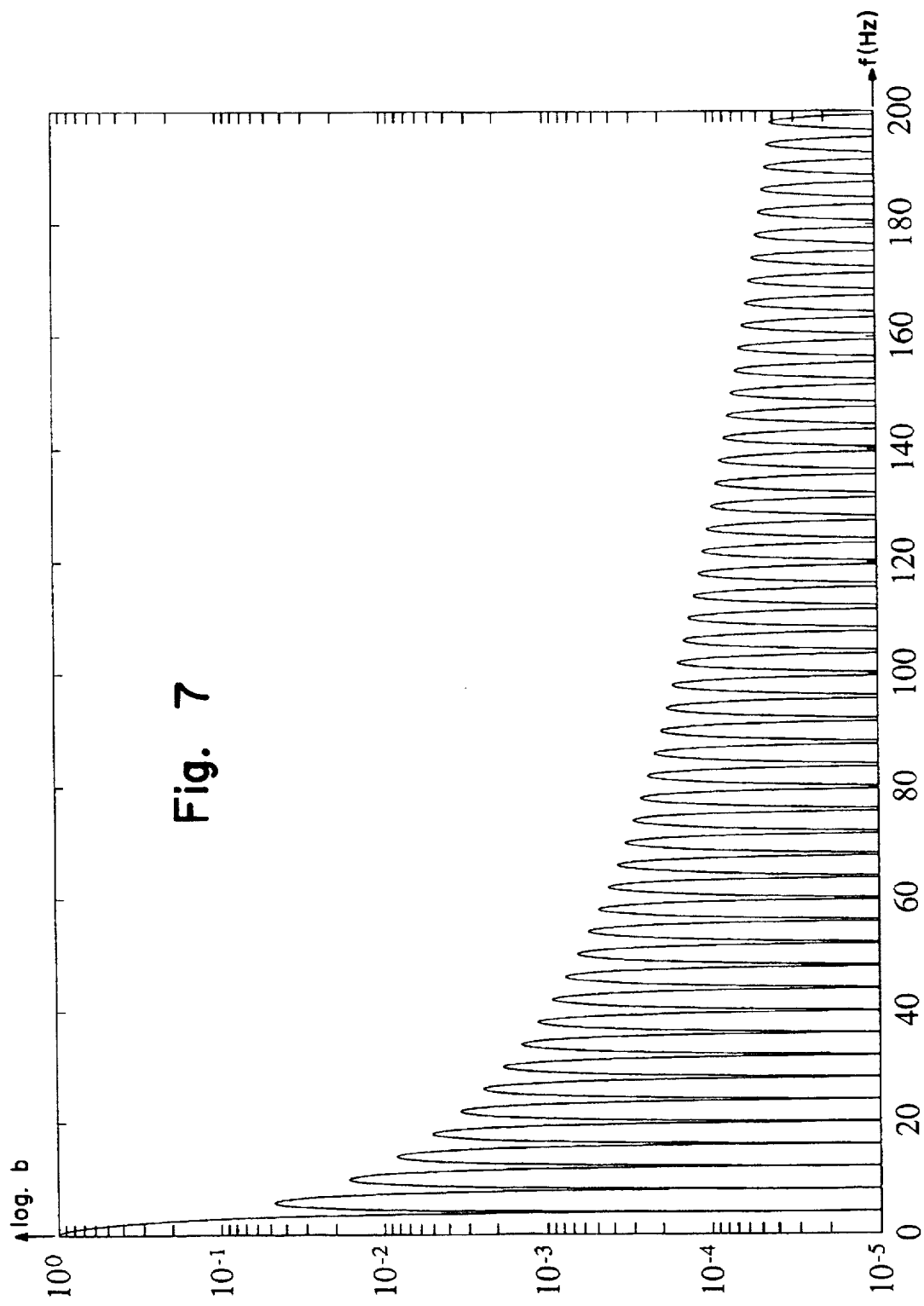
FIG. 7 shows an attenuation curve of a digital filter.

The digital filter 9 preferably has an attenuation curve similar to the one shown in FIG. 7. The attenuation curve has a damping, e.g., every 4 Hz. The attenuation curve of the digital filter 9 contains a filter attenuation b represented logarithmically in function of the frequency f. The digital filter 9 contains at least one filtering step whose transmission function is at least of the second order, i.e., it is advantageously a $sinc^K$ filter where $K \geq 2$. Since it is not always possible to build up the entire digital filter 9 as a serially functioning structure with the existing clocking frequency, the digital filter 9 is preferably subdivided into two steps and thus contains a serial connection of a first $sinc^2$ filter 42 and a downstream second $sinc^2$ filter 43 (see FIG. 9) if the filtering step is a $sinc^2$ filter.

Figure 8:
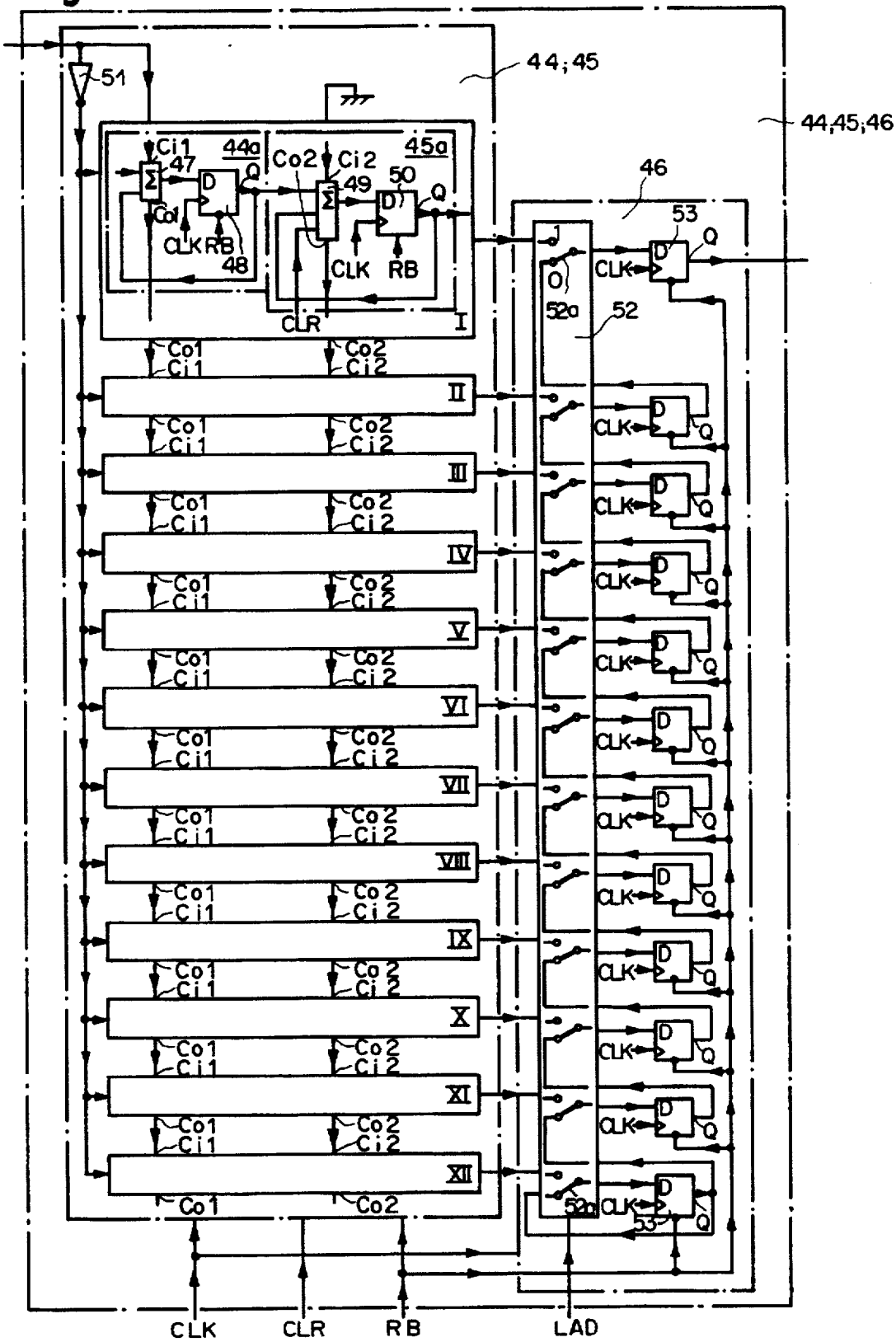
FIG. 8 is a schematic diagram of two digital integrators connected in series and of a downstream decimation element.
Figure 9:
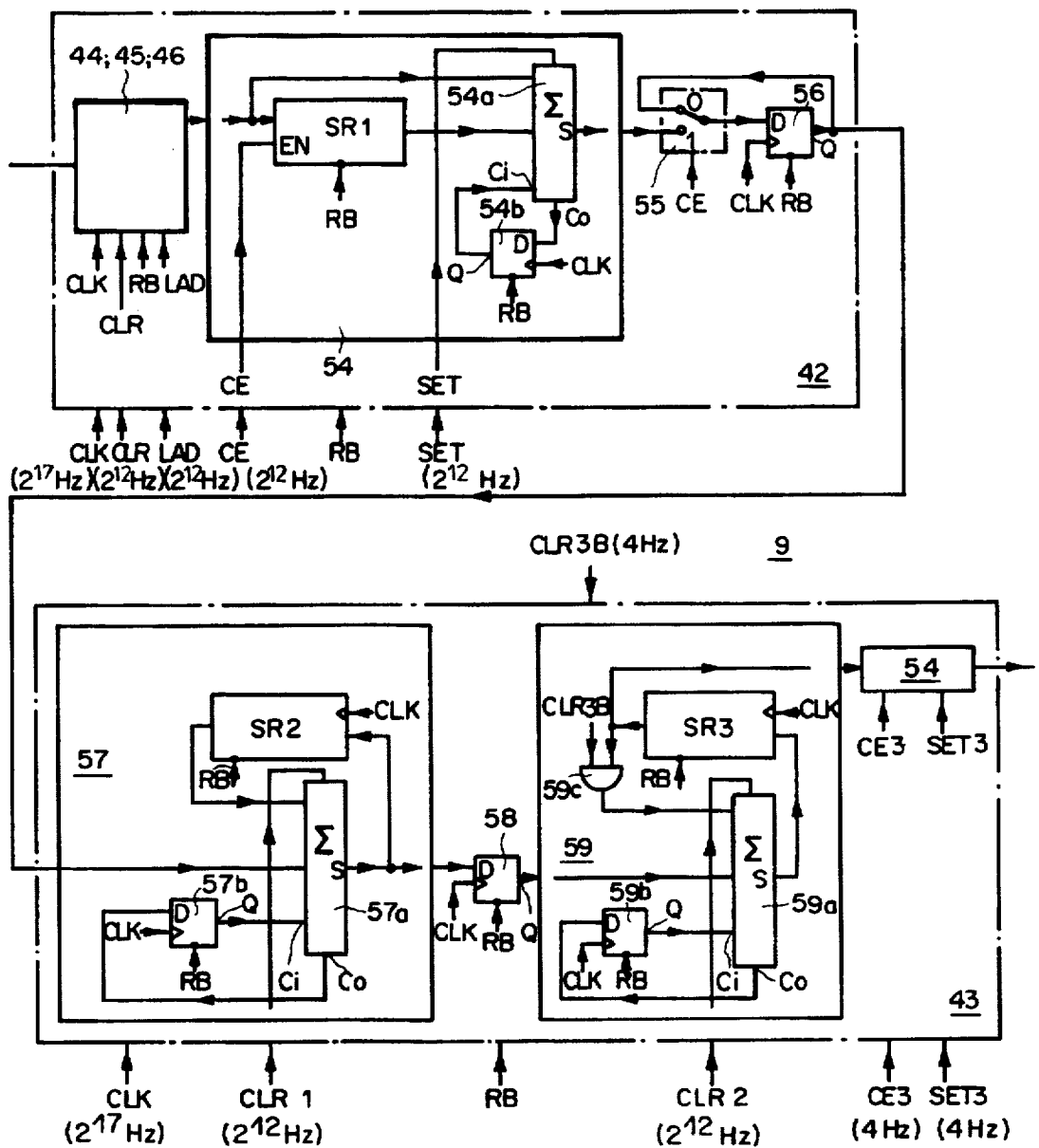
FIG. 9 is a schematic diagram of the digital filter.

The first $sinc^2$ filter 42 has preferably 12 bits. As can be seen in FIG. 9, it contains at the input an arrangement 44, 45, 46 which in turn contains a digital double integrator 44, 45 as can be seen in FIG. 8. After the double integrator 44, 45 a decimation carried out in the decimation element 46 is provided in the arrangement 44, 45, 46. In order to minimize the switching costs and thereby minimize the necessary chip surface as much as possible the decimation factor of the $sinc^2$ filter 42, if this is implemented at least in part as a parallel connection, is only selected to be as large as absolutely necessary so that the following $sinc^2$ filter 43 may be built up entirely as a serial connection. The $sinc^2$ filter 42 has therefore preferably a decimation factor value $32=2^5$. The arrangement 44, 45, 46 can be made in the form of a parallel or serial connection. In FIG. 8 it is assumed that it is made in the form of a parallel connection and has 12 bits. In this case a 1-bit double integrator is provided per bit, i.e., the double integrator 44, 45 contains twelve identically built-up 1-bit double integrators I to XII in FIG. 8. Each 1-bit double integrator I or II . . . or XII contains a first digital 1-bit integrator 44a and serially connected downstream a second digital 1-bit integrator 45a. The second digital 1 bit integrater 45a being provided with a reset-to zero realized by means of an external reset signal CLR. In the parallel design, the twelve 1-bit integrators 44a thus constitute a first digital integrator 44 and the twelve 1-bit integrators 45a a second digital integrator 45 connected serially downstream of the integrator 44. Each input of the 1-bit integrator 44a which is at the same time the input of the 1-bit double integrator I or II . . . or XII is formed by a first input of an adder 47 whose output is connected to a D input of a D flip flop 48 operating as a delaying element. A Q output of the latter constitutes on the one hand an output of the respective 1-bit integrator 44a and goes on the other hand to a second input of the adder 47. The output of the first 1-bit integrator 44a is connected to an input of the appertaining second 1-bit integrator 45a which contains an adder 49 and a D flip flop 50. The first and the second 1-bit integrator 44a and 45a are built up in a similar manner with the difference that the adder 49 has a third input to achieve the reset by means of the external reset signal CLR which feeds the third input of all twelve adders 49. Each output of the second 1-bit integrator 45a is also one of twelve outputs of the double integrator 44, 45 and is connected to an appertaining input among the twelve inputs of the decimation element 46. An input of the digital filter 9 which is at the same time an input of the arrangement 44, 45, 46 (see FIG. 9) and thereby of the double integrator 44, 45 is connected via an inverter 51 to the inputs of the 1-bit double integrators I to XII, said inputs thus being connected in parallel. The input of the double integrator 44, 45 is furthermore connected directly to a carry-in input Ci1 of the adder 47 of a 1-bit double integrator I first in sequence while a carry-in input Ci2 of the adder 49 of the first 1-bit double integrator I is grounded. Each carry-out output Co1 or Co2 of the adders 47 and 49 of a 1-bit double integrator I or II or XII is connected to a carry-in input Ci1 or Ci2 of the adder 47 or 49 of the next double integrator II or III . . . or XII in the sequence, so that the respective carry-out outputs and carry-in inputs Co1 and Ci1 or Co2 and Ci2 form a recurrent connection. The carry-out outputs Co1 and Co2 of the adder 47 or 49 of the last 1-bit double integrator XII in the sequence are not connected anywhere. The decimation element 46 contains one single-pole commutator 52a and one D flip flop 53 per bit. The twelve single-pole commutators 52a together constitute a multi-bit switch 52 and can all be commutated simultaneously by means of a common periodic load signal LAD. The connection between the twelve commutators 52 and the twelve D flip flops 53 are such that the D-input of each D flip flop is connected in periodic alternation to the appertaining input of the decimation element 46 and to a Q output of the D flip flop 53 next in the sequence. The Q output of the last D flip flop 53 in the sequence is connected in the last case by means of its appertaining single-pole commutator 52a in addition to the D input of its own D flip flop 53. When the load signal LAD has a logical value "1" the multi-bit switch 52 connects, e.g., the twelve outputs of the double integrator 44, 45 to the D inputs of the twelve D flip flops 53, so that the 12-bit value appearing at that moment at the first one is loaded in parallel into the twelve D flip flops 53. When the load signal LAD on the other hand has a logical value "0" the multi-bit switch 52 connects the twelve D flip flops 53 in series to each other so that they constitute a 12-bit shift register whose output is a Q output of the first D flip flop 53 in the sequence, said output then also constituting an output of the decimation element 46 as well as of the arrangement 44, 45, 46. The clocking signal CKL of frequency $2^{17}$ Hz feeds the clocking inputs of all the D flip flops 48, 50, and 53. The periodic load signal LAD which feeds the control input of the multi-bit switch 52 and the reset signal CLR both have a clocking frequency that is reduced from the clocking signal CLK by the decimation factor, e.g., $2^{17}/2^5$ Hz$=2/^{12}$ Hz when the decimation factor of the $sinc^2$ filter 42 has a value $32=2^5$. This means that every $2^{-12}$ seconds the second digital integrator 45 is on the one hand reset to zero and the output value of the double integrator 44, 45 appears on the other hand serially in time at the output of the decimation element 46. The reset inputs of the D flip flops 48, 50 and 53 are fed from a common reset signal RB for general resetting to zero of the arrangement 44, 45, 46 when this is required.

The arrangement 44, 45, 46 and thereby the decimation is followed by a digital differentiation element 54 as shown in FIG. 9 so that the first $sinc^2$ filter 42 of the first digital integrator 44 contains the first double integrator 44, the downstream second double integrator 45, the decimation available after the latter as well as the differentiation element 54 downstream of the decimation. A single-pole commutator 55 controlled by means of a control signal CE switches a D input of a synchronization flip flop 56 over, from an output of the differentiation element 54, e.g., when the control signal CE has a logical value "1" to a Q output of the synchronization flip flop 56 when the control signal CE has a logical value "0". The latter Q output is at the same time an output of the first $sinc^2$ filter 42. The differentiation element 54 can be a parallel or serial connection and in the latter case has the structure shown in FIG. 9. In this case it contains shift register SR1, a serial adder 54a and a D flip flop 54b. If the first $sinc^2$ filter 42 is a 12-bit filter, the shift register SR1 has also 12 bits. A Q output of the D flip flop is connected to a carry-in input Ci of the adder 54a whose carry-out output Co is connected to a D input of the D flip flop 54b. A serial input of the shift register SR1 constitutes an input of the differentiation element 54 and is connected to a first input of the adder 54a while a serial output of the shift register SR1 is connected to a second input of the adder 54a. The control signal CE feeds an enable input EN of the shift register SR1 while the reset signal RB goes to the reset inputs of the shift register SR1 and of the D flip flops 54b and 56. The clocking signal CLK feeds the clocking inputs of the D flip flops 54b and 56 while a setting signal SET goes to a third input of the adder 54a whose output S constitutes the output of the differentiation element 54.

The second $sinc^2$ filter 43 preferably has 32 bits. As shown in FIG. 9, it contains a first digital integrator 57 and a second digital integrator 59 connected downstream via a synchronization flip flop 58, said digital integrator 59 being provided with a reset to zero realized by means of a reset signal CLR2. The second integrator 59 is again followed by a decimation which is followed by an additional digital differentiation element 54 having the same internal structure as the differentiation element 54 of the first $sinc^2$ filter 42 with the only difference that the shift register SR1 is in each case a 32-bit shift register exactly as the shift registers SR2 and SR3 mentioned below when the second $sinc^2$ filter 43 is a 32-bit filter. The latter filter has preferably a decimation factor value $1024=2^{10}$. The integrators 57 and 59 as well as the differentiation element 54 can again be parallel or serial connections. The latter was assumed in FIG. 9. In that case the first integrator 57 contains the shift register SR2, a serial adder 57a and a D flip flop 57b while the second integrator 59 contains the shift register SR3, a serial adder 59a, a D flip flop 59b and a gate 59c. A Q output of the D flip flop 57b is connected to a carry-in input Ci of the serial adder 57a whose carry-out output Co is connected to a D-input of the D flip flop 57b. A first input of the serial adder 57a constitutes an input of the first integrator 57 and thereby also of the second $sinc^2$ filter 43. An output S of the serial adder 57a constitutes an output of the first integrator 57 and is in addition connected to a serial input of the shift register SR2 whose serial output is connected to a second input of the serial adder 57a. The output of the first integrator 57 is connected to a D-input of the synchronization flip flop 58 whose Q output is connected to an input of the second integrator 59. A Q output of the D flip flop 59b is connected to a carry-in input Ci of the serial adder 59a whose carry-out output Co is connected to a D input of the D flip flop 59b. A first input of the serial adder 59a constitutes the input of the second integrator 59. An output S of the adder 59a is connected to a serial input of the shift register SR3 whose serial output constitutes an output of the second digital integrator 59 and is in addition connected to a first input of the AND gate 59c whose output is connected to a second input of the serial adder 59a. The output of the second digital integrator 59 is connected to an input of the differentiation element 54 of the second $sinc^2$ filter 43 whose output constitutes an output of the second $sinc^2$ filter 43 and thereby of the digital filter 9. The clocking signal CLK and the reset signal RB feed the clocking inputs or the reset inputs of the D flip flops 57b, 58, and 59b as well as of the shift register SR2 and shift registers SR3 while a reset signal CLR1 and the reset signal CLR2 respectively go to a third input of the serial adder 57a or of the adder 59a. The frequency of the reset signals CLR1 and CLR 2 is, e.g., $2^{17}/2^5=2^{12}$ Hz. A reset signal CLR3B (i.e., clear 3 inverted) feeds a second input of the AND gate 59c while a signal CE3 feeds the enable input EN of the shift register SR1 contained in the differentiation element 54 of the $sinc^2$ filter 43. A SET3 signal on the other hand feeds the third input of the adder 54a contained there. The signal CE3 triggers the decimation at the input of the differentiation element 54 of the $sinc^2$ filter 43 since its frequency, just as that of the signals CLR3B and SET3 is equal to the frequency $2^{12}$ Hz of the signal LAD less the decimation factor of the $sinc^2$ filter 43, i.e., equal to $2^{12}/2^{10}$ Hz=4 Hz when the decimation factor of the $sinc^2$ filter 43 has the value $2^{10}=1024$.

Figure 10:
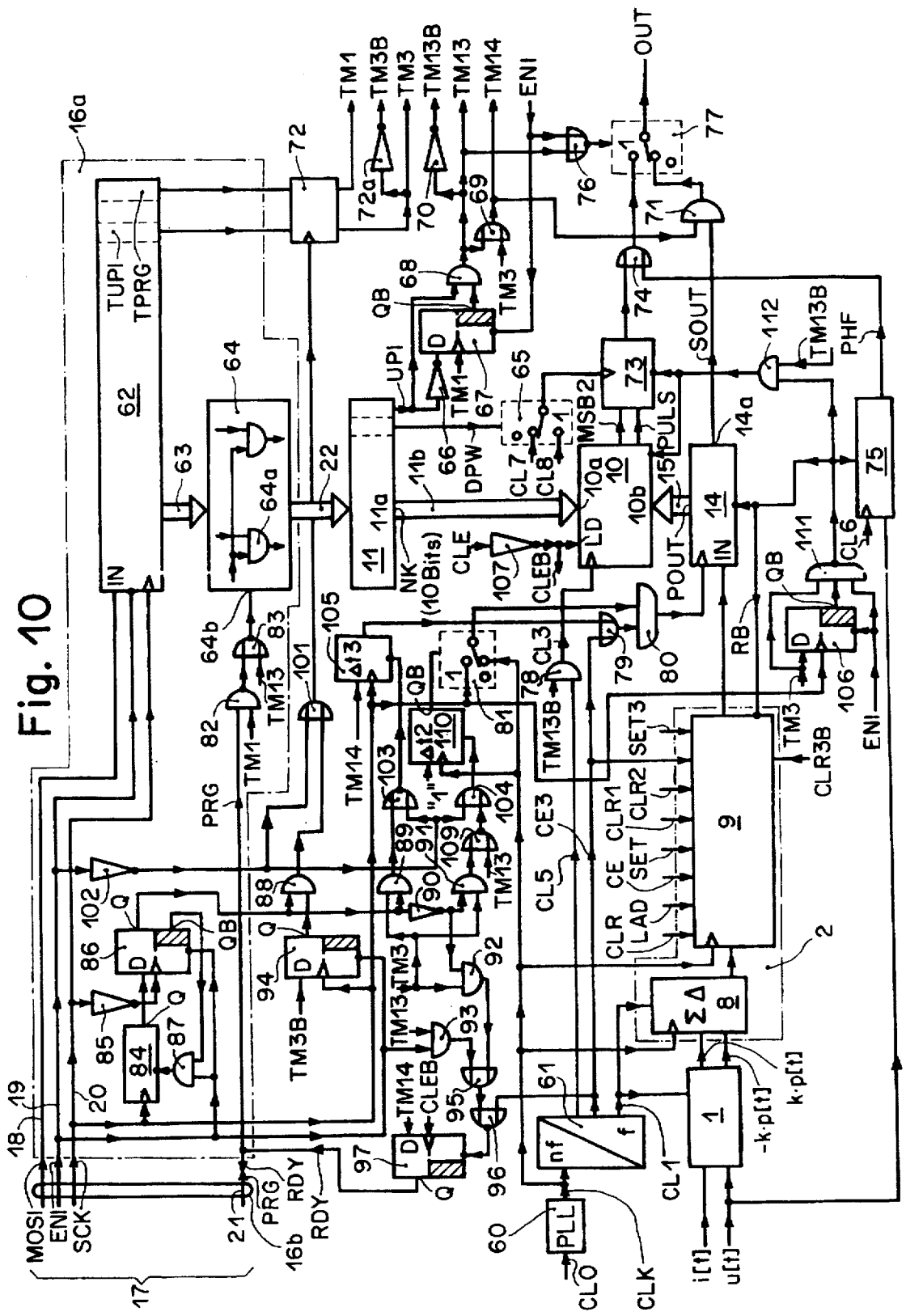
FIG. 10 shows a detailed representation of the second variant.
Figure 11:
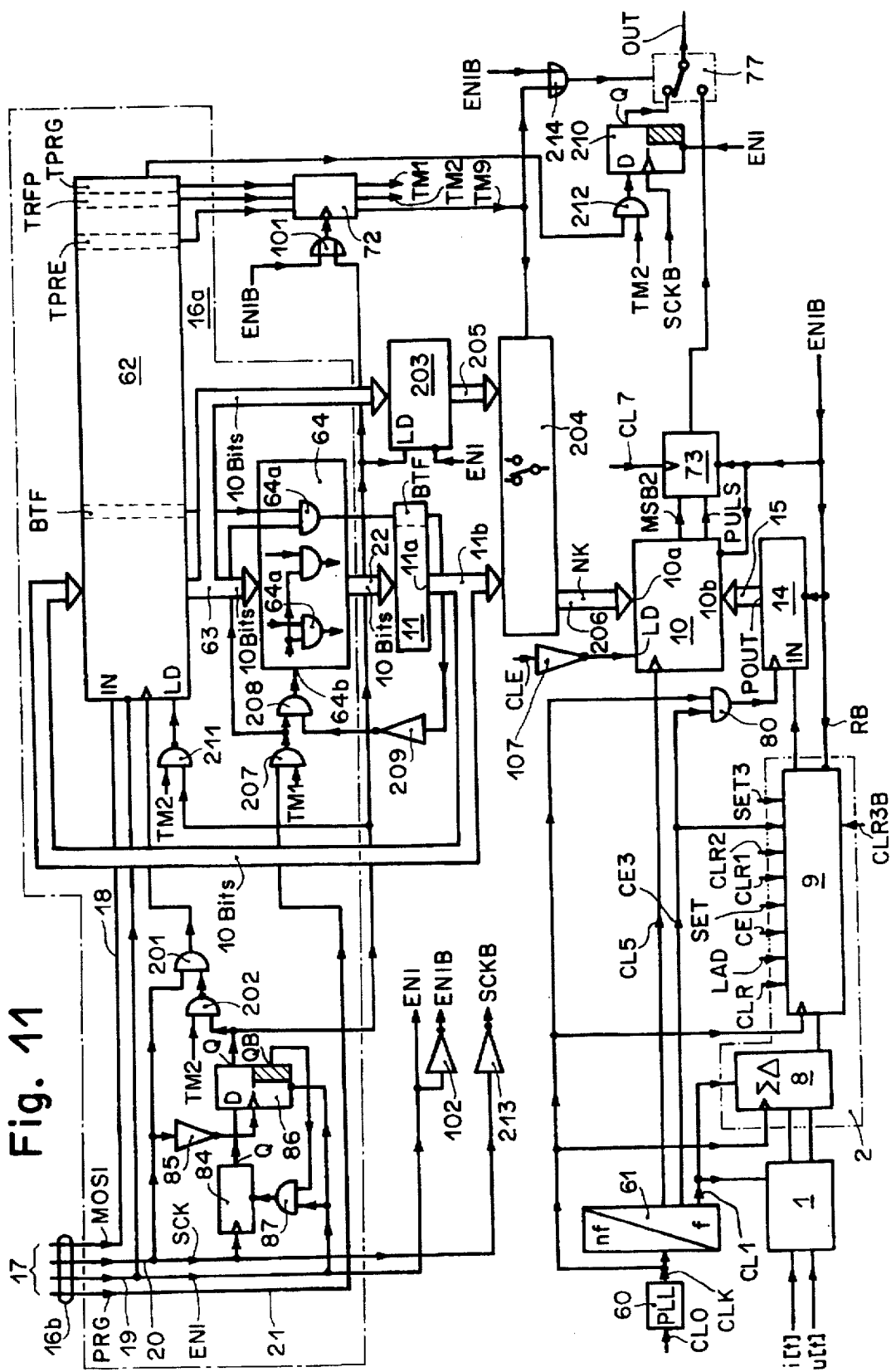
FIG. 11 shows an additional detailed representation of the second variant, with additional features.

FIG. 10 shows the second variant according to the invention in detail and thereby the arrangement according to the invention shown in FIG. 4 without the external computer 17. FIG. 10 shows a phase locked loop (PLL) 60 whose input is fed by a clocking signal CL0 with a frequency of, e.g., $2^{13}$ Hz. This frequency is multiplied in the phase locked loop 60 by a factor of, e.g., $2^4$ so that a synchronous clocking signal CLK of frequency $2^{17}$ Hz appears at its output, said frequency being subsequently divided in a frequency divider 61 in order to produce different clocking and reset signals which then appear at one output of the frequency divider 61. For the sake of clarity in the drawing FIG. 10 only shows three outputs at which the clocking signal CL1 frequency $2^5$ Hz or the signal CE3 of frequency 4 Hz appears. It is however understood that the signals CLR1($2^{16}$ Hz), CLR2 ($2^{15}$ Hz), CLR($2^{12}$ Hz), LAD($2^{12}$ Hz), CE($2^{12}$ Hz), SET($2^{12}$ Hz), CL6($2^{11}$ Hz), SET3(4 Hz), CLR3B(4 Hz), CLE(4 Hz) and CLEB (i.e., CLE inverted: 4 Hz) are produced in the frequency divider 61 by frequency division which is followed if necessary by a synchronization and/or a delay by means of D-flip flops to be then transmitted to the circuit. The clocking signals CL7($2^{13}$ Hz) and CL8($2^{12}$ Hz) are on the other hand derived directly from the clocking signal CL0. The external computer 17, as mentioned earlier, feeds the communications interface logic 16a (see FIG. 4) via the interface bus connection 16b. The communication interface 16 is preferably a standardized synchronous serial interface. In the interface bus connection 16b at least three conductors are present in this case, whereby a signal MOSI is transmitted over a conductor 18, an interface clocking signal SCK over a conductor 20 and a signal MISO over a third conductor. MOSI means "master out, slave in" while MISO means "Master in, slave out", whereby the computer 17 is the master computer and the arrangement according to the invention is the slave in each case. For a multi-measuring system application a fourth conductor is provided in the interface bus connection 16b for the transmission of an interface enable signal (enable interface) ENI which enables only one of the measuring system at the right moment, i.e., its signals MISO and SCK, so that the measuring systems cannot hinder each other. To read information into the computer 17 a fifth conductor 21 at which a ready signal RDY appears which is transmitted from the communication interface 16 to the computer 17 is provided in the interface bus connection 16b. The fifth conductors of all measuring systems of a multi-measuring system arrangement are either connected via a so-called "wired or" connection to an interrupt input of the computer 17 or are connected individually to separate inputs of the latter. A programming impulse PRG can also be transmitted via conductor 21 from the computer 17 to the communication interface 16. Thus one of the four signals MOSI or ENI or SCK or PRG is transmitted via conductors 18 to 21 from the computer 17 to the arrangement according to the invention while the signal RDY is transmitted in the opposite direction from the latter to the computer 17. The communications interface logic 16a contains a shift register 62. The computer 17 feeds the signal MOSI over the conductor 18 to a serial input IN of the shift register 62, the signal ENI over the conductor 19 to a reset input of the shift register 62 and the clocking signal SCK over the conductor 20 to a clocking input of the shift register 62. The shift register 62 has at least as many bits as the calibration value $N_K$ has bits, e.g., 10 bits. In FIG. 10 it is assumed that the shift register 62 has at least four additional bits, i.e.:

- one DPW bit having a logical value "1" when the output impulses of the variant 2 is to have a double impulse length,
- one UPI bit having a logical value "1" when the output impulse of the variant 2 is to have a double impulse length,
- one TUPI bit having a logical value "1" when the modified second variant is to be tested, and
- one TPRG bit having a logical value "1" when the calibration value $N_K$ of the second variant is to be programmed The serial communication interface 16 is a receiver and memory for the bit values of a code word related to the calibration value $N_K$ and for the additional bits DPW, UPI, TUPI, and TPRG to which at least three additional bits TRFP, TPRE, and BTF are added in the arrangement shown in FIG. 11 emitted by the computer 17 in the course of programming and/or testing. The code word related to the calibration value $N_K$ is either the calibration value $N_K$ itself or a pseudo-calibration value which is to be explained further below. The programming impulse PRG is used to store the codeword related to the calibration value $N_K$ into the non-volatile memory 11 by means of one of the received additional bits, i.e., TPRG. The shift register 62 is used for time-serial storage of the bit values of the calibration value $N_K$ or the pseudo calibration values as well as the bits DPW, UPI, TUPI, TPRG, TRFP, TPRE, and BTF emitted by the computer 17. The bit values emitted by the computer 17 preferably include bits in the form of the time serial signal MOSI transmitted over the conductor 18 of the communication interface bus connection 16b. The outputs appertaining to the 10 bits of the calibration value $N_K$ as well as the two outputs of the shift register 62 appertaining to the bits UPI and DPW, i.e., a total of twelve outputs, are connected via a bus connection 63 to the first inputs of an equal number of enable gates 64a of a programming enabling arrangement 64 of the communications interface logic 16a. Second inputs of the enable gates 64a, e.g., AND gates, connected to each other constitute a programming input 64b of the programming enable arrangement 64. The outputs of the enable gates 64a are connected via bus connection. 22 to a bus input of the non-volatile memory 11. The outputs 11a of the non-volatile memory 11 appertaining to the ten bits of the calibration value $N_K$ are connected via the bus connection 11b to the first bus input 10a of the arrangement 10 which is a digital hardware quantizer in the second variant, as mentioned earlier. The programming enable arrangement 64 serves to retransmit at least past of the bit values stored in the shift register 62, i.e., those of $N_K$ (or of pseudo-calibration values), of DPW and of UPI (as well as of BTF: see FIG. 11) to the non-volatile memory 11 to be stored therein.

An output of the non-volatile memory 11 appertaining to the bit DPW is connected to a control input of a single-pole commutator 65. An output of the non-volatile memory 11 appertaining to the bit UPI goes via an inverter 66 to a D-input of a D flip flop 67 and directly to a first input of an AND gate 68 at the output of which a signal TM13 appears, said signal going in turn to a first input of an OR gate 69 and to an input of an inverter 70. A signal TM 13B, i.e., TM13 inverted appears at the output of the inverter 70. A signal TM14 appears at the output of the OR gate 69 a and goes to a first input of an AND gate 71 whose second input is connected to the serial output 14a of the serial/parallel converter 14. An output of the shift register 62 appertaining to the bit TUPI is connected to an input of an appertaining memory cell of an auxiliary memory 72 at the output of which a signal TM3 appears and feeds a second input of the OR gate 69. The auxiliary memory 72 consists, for example, of flip flops. The signal TM3 is in an inverter 72 inverted to produce the signal TM3B. An output of the shift register 62 associated with the signal TPR6 is transmitted to the input of an associated memory cell of the auxiliary memory 72. The output signal TM1 is a clock input of the D-flip flop 67, whose aB is connected to the AND gate 68. The auxiliary memory 72 thus serves to store an additional portion of the bit values stored in the shift register 62, i.e., those of the bits TUPI and TPRG (as well as TRFP and TPRE according to FIG. 11).

The two output signals PULS and MSB2 of the arrangement 10 each feed a separate input of an impulse generator 73 whose clocking input is switched over by means of a single-pole commutator 65 either to the clocking signal CL7 of frequency $2^{13}$ Hz if the bit DPW has a logical value "0", or to the clocking signal CL8 of frequency $2^{12}$ Hz if the bit DPW has a logical value "1". As a result, the time basis of the impulse generator 73 is switched over i.e., doubled. In the impulse generator 73 impulses are generated the lengths of which depend on the positive or negative prefix of the found energy, i.e., if an impulse of the signal PULS is associated with a positive energy (MBSB2="0"), an impulse of length 122 μs is produced at the output of the impulse generator 73, and if it is associated with a negative energy (MSB2="1") an impulse of length 61 μs is produced if the clocking signal CL7 is active as time basis. If on the other hand the clocking signal CL8 is active as time basis, the corresponding values 244 μs and 122 μs are twice as large. The output of the impulse generator 73 is connected to a first input of an OR gate 74. The alternating voltage u[t] goes to an input of a voltage monitoring circuit 75 whose clocking input is supplied by the clocking signal CL6 and at the output of which an impulse of length 488 μs as phase fail signal PHF is produced if a minimum value of the alternating voltage u[t] is not reached, said impulse going then to a second impulse of the OR gate 74. The signal TM13 goes to a first input and the signal ENI to a second input of a NOR gate 76 whose output is connected to a control input of a single-pole commutator 77. The latter switches an output OUT of the arrangement according to the invention over from an output of the AND gate 71 to an output of the OR gate 74. To make it possible to use multi-measuring system applications the output OUT is preferably a tri-state output. The clocking signal CL5 goes to a first input of an AND gate 78 at the second input of which the signal TM13B appears and whose output signal is the clocking signal CL3 of frequency $2^{14}$ Hz which feeds a clocking input of the arrangement 10. The signal CE3 of frequency 4 Hz feeds a first input of an OR gate 79 whose output is connected to a first input of an AND gate 80 whose output is in turn connected to a clocking input of the serial/parallel converter 14. A second input of the AND gate 80 is connected by means of a singe-pole commutator 81 either to the clocking signal CLK of frequency $2^{17}$ Hz or to the clocking signal SCK. The computer 17 feeds the programming signal PRG via a conductor 21 to a first input of a NAND gate 82. The signal TM1 fees a second input of the NAND gate 82 whose output is connected to a first input of a NOR gate 83 at whose second input the signal TM13 appears and whose output is connected to the programming input 64b of the programming enable arrangement 64. The clocking signal SCK is connected to a clocking input of a counter 84 and via an inverter 85 to a clocking input of a D flip flop 86. A serial Q output of the counter 84 is connected to a D input of the D flip flop 86 whose QB output is connected to a first input of an AND gate 87 at the second input of which the signal ENI appears and whose output is connected to a reset input of the counter 84. A Q output of the D flip flop 86 is connected to the first inputs of two AND gates 88 and 89 and via an inverter 90 to the first inputs of two AND gates 91 and 92. At the second inputs of the AND gates 89, 91 and 92 the signal TM3 appears, while the signal TM13 appears at a first input of an AND gate 93. The signal ENI feeds a second input of the AND gate 93 and a reset input of a D flip flop 94 at the D input of which the signal TM3B appears and at the clocking input of which the clocking signal SCK appears while its Q output is connected to a second input of the AND gate 88. One output each of the AND gates 92 and 93 is connected to one input of an OR gate 95 whose output is connected to a first input of a NOR gate 96. The signal CE3 feeds a second input of the latter while its output is connected to a reset input of a D flip flop 97 at the D input of which the signal TM14 appears and at the clocking input of which the signal CLEB appears. A signal RDY appears at a Q output of the D flip flop 97 which is connected to the conductor 21. RDY is preferably a tri-state signal so that it may not be interfered with and/or overwritten by a programming impulse PRG which might possibly appear at the same time on the conductor 21. An output of the AND gate 88 is connected to a first input of an OR gate 101 whose output is connected to a clocking input of the auxiliary memory 72. The signal ENI feeds a second input of the OR gate 101 via an inverter 102 as well as a first input of a NOR gate 103 and that of an OR gate 104. An output of the AND gate 89 is connected to a second input of the NOR gate 103 whose output is connected to a reset input of a time delay element 105 at the input of which the signal TM14 appears and whose output is connected to a second input of the OR gate 79. The clocking signal SCK feeds a clocking input of the time delay element 105 and that of a D flip flop 106 while the signal CLE feeds the loading input LD of the arrangement 10 via an inverter 107. An output of the AND gate 91 is connected to a first input of a NOR gate 109 at the second input of which the signal TM13 appears and whose output is connected to a second input of the OR gate 104. An output of the latter is connected to a reset input of a time delay element 110 at the input of which a logical value "1" appears and at the clocking input of which the clocking signal CLK appears, while its QB output is connected to a control input of the single-pole commutator 81. The signal TM3 feeds a D input of the D flip flop 106 and a first input of a NAND gate 111 whose second input is connected to a QB output of the D flip flop 106, while its output is connected to a first input of an AND gate 112, and to a reset input of the digital filter 9, one of the serial/parallel converter 14 and one of the voltage monitoring circuit 75, whereby the reset signal at the reset input of the digital filter 9 is designated by RB. At a second input of the AND gate 112 the signal TM13B appears while its output is connected to a reset input of the arrangement 10 and to one of the impulse generator 73. The signal ENI feeds a third input of the NAND gate 111 and a reset input of each of the D flip flops 67, 86 and 106.

The embodiment of the second variant shown in FIG. 11 is similar to the embodiment shown in FIG. 10 with some details omitted, with the following changes or additions. The signal CL5 goes directly to the clocking input of the arrangement 10 and the signals CE3 and CLK go directly to an input of the AND gate 80 whose output is connected to the clocking input of the serial/parallel converter 14. The communication interface 16 receives and stores in addition the bit values of the bits TRFP, TPRE, and BTF which are transmitted as signal MOSI by the computer 17 via the communications interface bus connection 16b to the arrangement according to the invention on the occasion of a calibration and/or a test. The signal MOSI is here again pushed into the shift register 62 which serves this time for the time-serial intermediate storage of the bit values of $N_K$, TPRG, TRFP, TPRE, and BTF. The shift register 62 has thus at least as many bit memory cells as there are bits in $N_K$, e.g., 10 bits, plus four bits for a total of fourteen. Below it is assumed that the shift register 62 has in all 32 bits so that in addition to the fourteen bits, additional transmitted bits may be stored, among them the bit TUPI which is not shown (see FIG. 10). The bit TRFP is a read bit, the bit TPRE a control bit, and the bit BTF a locking bit. If $N_K$ has ten bits, the last ten bits of the signal MOSI for example are the ten bits of the calibration value $N_K$, while, e.g., the first bit of the signal MOSI is the bit TPRG, the second bit the read bit TRFP, the ninth bit the control bit TPRE, and the eleventh and last bit the locking bit BTF. The bit TPRG has again a logical value "1" if the calibration value $N_K$ is to be stored in the non-volatile memory 11 on the occasion of calibration. The read bit TRFP has a logical value "1" when the contents of the non-volatile memory 11 are to be read for control purposes, e.g., before it is finally made definitive. The control bit TPRE has a logical value "1" if a test is to be made without storage in the non-volatile memory 11 whether the calculated value of $N_K$ is correct. The locking bit BTF has a logical value "1" when the value $N_K$ is definitively stored in the non-volatile memory 11 and is to be rendered irrevocably final. In FIG. 11 the interface clocking signal SCK feeds the clocking input of the shift register 62 via a first input of an AND gate 201.

The Q output of the D flip flop 86 is connected to a first input of a NAND gate 202 at the second input of which a signal TM2 appears while its output is connected to a second input of the AND gate 201. The ten parallel outputs of the shift register 62 appertaining to the ten bits of the calibration value $N_K$ are connected via the bus connection 63 not only to the bus input of the programming enable arrangement 64 but also to a bus input of an additional auxiliary memory 203. A multi-bit switch 204 is available to switch over the bus input 10a of the arrangement 10 from the bus output 11a of the non-volatile memory 11 to a bus output of the additional auxiliary memory 203. For this purpose a bus input of the additional auxiliary memory is connected via a bus connection 205 to ten first inputs of the multi-bit switch 204 while the output of the non-volatile memory 11 is connected via the bus connection 11b to ten additional inputs of the multi-bit switch 204 whose output is connected via a bus connection 206 to the bus input 10a of the arrangement 10. In addition, the output of the non-volatile memory 11 is connected via the bus connection 11b to a parallel input of the ten memory cells of the shift register 62 appertaining to the calibration value $N_K$ to retro-store the contents $N_K$ of the non-volatile memory 11 into the shift register 62 whose contents can then be transmitted to the computer 17 so that the contents $N_K$ of the non-volatile memory 11 can be read out therein. The programming enable arrangement 64 this time contains more than an $N_K$ number of bits, i.e., an enable gate 64a for an appertaining memory cell of the non-volatile memory 11 for storage therein of the locking bits BTF transmitted by the computer 17 via the communication interface 16 and put in intermediate storage in the shift register 62. A parallel output of the shift register 62 belonging to the bit BTF is connected to a first input of this additional enable gate 64a of the programming enable arrangement 64 whose second input is connected to an output of an AND gate 207 and to a first input of a locking gate 208, while its output is connected to an input of the additionally appertaining memory cell of the non-volatile memory 11. The locking gate 208 is an AND gate. The output of the memory cell concerned of the non-volatile memory 11 is connected via an inverter 209 to a second input of the locking gate 208 in order to lock the other enable gates 64a of the programming enable arrangement 64. For that purpose the output of the locking gate 208 is connected to the programming input 64b of the programming enable arrangement 64. The latter serves thereby to the retransmission of the values of the ten bits of $N_K$ as well as of the locking bit BTF to the non-volatile memory 11 to be stored therein. The computer 17 feeds via wire connection 21 a first input of the AND gate 207 with the programming impulse PRG. At the second input of the AND gate 207 lies the signal TM1. The signal ENI feeds a reset input of the auxiliary memory 203 and one of a D flip flop 210. The Q output of the D flip flop 86 is connected to a loading input LD of the auxiliary memory 203 and an input of a NAND gate 211 as well as to one of the OR gate 101. The signal ENIB supplies a reset input of the digital filter 9, one of the serial/parallel converter 14, one of the arrangement 10 and one of the impulse generator 73. The signal TM2 appears at a second input of the NAND gate 211 while its output is connected to a loading input LD of the shift register 62. A serial output of the latter is connected to a first input of an AND gate 212 at whose second input the signal TM2 lies and whose output is connected to a D input of the D flip flop 210. A clocking input of the latter is fed via an inverter 213 by the interface clocking signal SCK. Outputs of the shift register 62 appertaining to the bits TRFP and TPRE are connected to the inputs of appertaining memory cells of the auxiliary memory 72 at the outputs of which the signal TM2 or a signal TM9 appears. An output of the auxiliary memory 72 appertaining to the latter and thereby with the control bit TPRE is connected to a control input of the multi-bit switch 204 and to a first input of the OR gate 214 at the second input of which the signal ENIB lies, while its output is connected to a control input of the single-pole commutator 77. The latter either switches a Q output of the D flip flop 210 or the output of the impulse generator 73 to the output OUT of the arrangement according to the invention.

The arrangements shown in the FIGS. 10 and 11 function as follows:

Before every process mode the signal ENI, which is transmitted by the computer 17 t6 the arrangement according to the invention via conductor 19, has a logical value "0" which resets the components 84,86,94, and 62 to zero or loads zero values from the reset shift register 62 into the auxiliary memory 72 so that the latter is also reset to zero and its output signals TM1 and TM3 are both zero. At the beginning of a process mode the computer 17 sets the signal ENI to a logical value "1" causing the components 62, 86, and 94 to be enabled and the counting process of the counter 84 to be started. The latter counts, from the starting moment on, the periods of the clocking signal SCK transmitted by the computer 17 over the conductor 20 which shifts the signal MOSI transmitted by the computer 17 over the conductor 18 into the shift register 62 where its bits are stored as soon as the shift register 62 is enabled. It is assumed below that the signal MOSI and the shift register 62 have 32 bits each. The counter 84 then counts to 32. At the 31st rising flank of the clocking signal SCK, a logical value "1" appears at the output of the counter 84, said logical value being loaded by means of the inverter 85 into the D flip flop 86 at the 32nd falling flank of the clocking signal SCK. The QB output signal of the latter then resets the counter 84 to zero whereupon a logical value "0" is again loaded into the D flip flop 86 with a delay of one period of the clocking signal SCK. In other words: at the 32nd falling flank of the clocking signal SCK, i.e., when 31 bits of the signal MOSI have been pushed into the shift register 62 and have been stored therein, an impulse appears at the Q output of the D flip flop 86. This impulse reaches the clocking input of the auxiliary memory 72 via gates 88 and 101 (see FIG. 10) or via gate 101 (see FIG. 11) where it causes part of the bits of the signal MOSI stored in the shift register 62 to be stored in their appertaining memory cells of the auxiliary memory 72.

At the end of each process mode the computer 17 completes the mode by switching the ENI signal back to zero whereby the arrangement according to the invention is reset to zero or zero values are loaded into the auxiliary memory 72 so that the output signals TM1, TM2, TM3, and TM9 of the latter are again zero.

Before starting up the second variant for the first time, the calibration value $N_K$ must be calibrated, i.e., its digital value must be transferred as part of the signal MOSI time serially from the computer 17 via conductor 18 to the arrangement according to the invention, i.e., to its communication interface 16 to be then stored in the non-volatile memory 11. Hereinafter it is assumed that the last ten bits of the signal MOSI are the ten bits of the calibration value $N_K$. In the programming mode the first bit TPRG of the signal MOSI has a logical value "1", the third and twelfth last bit TUPI or UPI each a logical value zero, as well as the eleventh last bit DPW any logical value. The logical value of the signals TM3, TM13, and TM14 are and remain zero during the entire programming modus since the two appertaining bits UPI and TUPI are equal to zero. The signals TM3B and TM13B have therefore a logical value "1" during the entire programming mode. As soon as the bit TPRG is stored in the auxiliary memory 72, the signal TM1 assumes a logical value "1" which enables the gate 82 or 207. A brief programming impulse PRG, of a duration of, e.g., 10 µs, transmitted subsequently by the computer 17 via the conductor 21 reaches the programming input 64b of the programming enable arrangement 64 via the gates 82 and 83 or 207 and 208 causing the connected enable gates 64a to be enabled for the duration of the programming impulse. This causes the bits UPI and DPW as well as the ten bits of the calibration value $N_K$ to be loaded into the non-volatile memory 11 from where the latter ten bits are transmitted further via bus connection 11b to the bus input 10a of the arrangement 10. Since the signal ENI is equal to 1 during the programming mode, the output signal of the NOR gate 76 (see FIG. 10) has a logical value "0", so that the output OUT of the arrangement according to the invention is connected via the commutator 77 to the output of the AND gate 71 which is locked by the signal TM14, so that no impulse representing an energy reaches the output OUT. Upon completion of the programming mode, the signal TMI becomes zero once more due to the general resetting and the gate 82 or 207 is again locked against any further programming impulse PRG. The computer 17 can then be removed and the arrangement according to the invention can be stored and/or sold.

The memory 11 is preferably a field programmable read-only memory FPROM each of whose memory cells is provided, e.g., with a diode or Zener diode and contains normally, i.e., in the presence of diode or Zener diode, a logical value "0". For this purpose the diodes or Zener diodes are provided with an external wiring that if they are present, a logical value "0" appears at the output of each of the memory cells concerned. If on the other hand a logical value "1" is to be stored in a memory cell, the diode or Zener diode of the memory cell concerned must be destroyed, i.e., burned through by overload current during programming by means of a current impulse so that it practically no longer exists. The loading of the memory 11 is carried out in this case by burning in. In the absence of diode or Zener diode, the still remaining external wiring causes a logical value "1" to appear at the output of the memory cell concerned. If a digital calibration value $N_K$, which as a rule contains several bit values "0" and "1", is to be stored in the memory 11, all its memory cells in which a bit value "0" is to be stored can remain unchanged during programming since the logical value "0" was already stored in them in advance by the presence of the appertaining diodes or Zener diodes. All the memory cells in which a bit value "1" is to be stored must on the other hand be programmed, i.e., their diodes or Zener diodes must be destroyed by a current impulse. In a first variant of the process according to the invention all the bit values "1" of the calibration value $N_K$ are loaded, i.e., burned in at the same time by means of one single programming cycle. If however many bit values "1" are to be stored and thus many diodes or Zener diodes are to be destroyed, the simultaneous loading of all the bit values "1" of the calibration value $N_K$ requires a very strong current impulse, i.e., up to 100 mA per bit value "1", which is not available as a rule. For this reason all the bit values "1" of the calibration value $N_K$ are preferably stored separately and one after the other in time in the memory 35 in a second variant of the process according to the invention by using a dedicated programming cycle. In the programming mode as many programming cycles are then gone through sequentially in time as there are bit values of the empty memory 11 which must be modified by calibration. In these programming cycles, in addition to a different digital calibration value, the additional bit TPRG, the interface clocking signal SCK, the enable signal ENI and the programming impulse PRG are conveyed via the communication interface 16 to the arrangement where the additional bit TPRG is stored in the auxiliary memory 72 and the digital pseudo-calibration value $N_K$ is stored by-means of the additional bit TPRG stored in the auxiliary memory 72 and of the programming impulse PRG into the memory 11. A digital pseudo-calibration value $N_K$ is here always the digital calibration value $N_K$ in which all bit values except one which had to be changed in the empty memory 11 have been replaced by a bit value of the empty memory 11. Thus when the empty memory 11 contains bit values "zero", each bit value which is to be changed in it by calibration must have a bit value "one" after calibration. Accordingly, as many programming cycles are gone through as there are bit values equal to "one" contained in the calibration value $N_K$, and a digital pseudo-calibration value is then the calibration value $N_K$ to be stored and in which all bit values equal to "one" except one have been replaced by a bit value equal to "zero". In each programming cycle one single bit value "1" of the calibration value $N_K$ is then stored, i.e., burned in, in the memory 11. For this purpose the concerned bit of the last ten bits of the signal MOSI transmitted by the computer 17 which are part of the calibration value $N_K$ equals logical value "1" while the other nine of these ten bits have logical values "0". Since only one single bit of $N_K$ has a bit value "1", only one single logical value "1" appears at the outputs of the programming enable arrangement 64. Thus only one single storage cell of the memory 11 is being programmed.

The input of the arrangement according to the invention at which the signal ENI appears is wired by means of a so-called pull-up resistance in such manner that after separation of the computer 17 a signal ENIB (i.e., ENI inverted) is equal to one and thereby the signal ENI is equal to zero in normal operation, so that the components 16, 67, 72, 84, 86, and 94 are taken out of operation or are reset to zero. The signals TMI, TM3, TM13 and TM14 thus have a logical value zero while the signals TM3B and TM13B each have a logical value "1". As a result of this the AND gate 78 is enabled among other things (see FIG. 10) so that the clocking signal CL5 reaches the clocking input of the arrangement 10 in the form of a clocking signal CL3. In addition a logical value "0" delayed by a time $\Delta t2$ by the time delay element 110 appears at the QB output of the time delay element 110, so that the commutator 81 switches the clocking signal CLK to an input of the AND gate 80 which has as a result that during the duration of the impulse the 4 Hz signal CE3 which reaches the other input of the AND gate 80 via the OR gate 79 the clocking signal CLK feeds the clocking input of the serial/parallel converter 14. The digital hardware quantizer with its calibration value $N_K$ stored during the programming mode in the memory 11 and the impulse generator 73 are in operation, so that the impulses representing the calculated energies appear at the output of the latter. Since the two signals ENI and TM13 are zero, a logical value "1" appears at the output of the NOR gate 76 which switches over the commutator 77 so that the output impulses of the impulse generator 73 reach the output OUT of the arrangement according to invention via the OR gate 74 and the switched-over commutator 77. In other words: the components 1, 8, 9, 10, 11, 14, 60, 61, 65, 73, 74, 75, 76, 77, 78, 79, 80, 81, 102, 104, 110, and 112 are needed. The value of the bit DPW stored during the programming mode in the memory 11 determines the position of the commutator 65 and thereby the value of the time basis $2^{13}$ Hz or $2^{12}$ Hz of the impulse generator 73 so that the output impulses of the latter and thereby those of the arrangement according to the invention have a simple or double impulse length, depending on the logical value "0" or "1" of the bit DPW.

Before starting up the modified second variant, a logical value "1" of the bit UPI must be stored in the non-volatile memory 11. This programming of the bit UPI is carried out in a programming mode in the same manner as the programming of the bit of the calibration value $N_K$ and of the bit DPW. If the bit UPI stored in the memory 11 has a logical value "1", the signals TM13 and TM14 are equal to one. The signals TM1 and TM3 have each a logical value zero.

The signal TM3B is equal to one and the signal TM13B is equal to zero. The latter value causes the two AND gates 78 and 112 to be locked (see FIG. 10), resulting in the digital hardware quantizer 10 and the impulse generator 73 being out of operation. As a result, the values of the calibration values $N_K$ stored in the memory 11 and those of the bit DPW are insignificant. In the modified second variant the output impulses of the arrangement according to the invention can therefore not be calibrated within the latter but must be calibrated in the external computer 17. In the modified second variant the latter is constantly connected at least over the four conductors 18 to 21 to the arrangement according to the invention. The signal MOSI is constantly zero since the bit UPI had been stored already earlier in the programming mode, so that no bit values other than zero can be pushed into the shift register 62 and accordingly no such values can be loaded into the auxiliary memory 72 and/or into the memory 11. Furthermore the signal TM13 places a logical value "0" over the NOR gate 83 at the programming input 64b so that all the enable gates 64a are locked, which prevents a reprogramming of memory 11. Since the signal TM13 is one, a logical value "0" appears at the output of the NOR gate 76 and prevents the commutator 77 from being switched over. The impulses at the serial output 14a of the serial/parallel converter 14 reach the output OUT of the arrangement according to the invention via the AND gate 71 enabled by the signal TM 14 and the non-commutated commutator 77, said output OUT being connected via an additional conductor to an input of the computer 17. In other words: the components 1, 8, 9, 14, 60, 61, 68, 69, 70, 71, 76,. 77, 79, 80, 81, 84, 85, 86, 87, 88, 93, 95, 96, 97, 102, 103, 104, 105, and 110 are needed and bit values representing the found power and which are put in intermediate storage in the serial/parallel converter 14 are transmitted time-serially from the output 14a to an input of the computer 17. When the computer 17 does not place a logical value "1" at the conductor 21 this means that it interprets every logical value "1" which is placed there by the arrangement according to the invention by means of the D flip flop 97 as a RDY signal with which the arrangement according to the invention informs it that it is ready to operate. Each of the signals CE3 and CLE has a frequency of 4 Hz. The latter signal is slightly time-delayed with respect to the first.

The rising flanks of the signal CLE inverted, i.e., of the signal CLEB load every 250 ms a logical value "1" into the D flip flop 97 since the signal TM14 is equal to one. The Q output signal of the D flip flop 97 reaches the computer 17 via conductor 21 in the form of signal RDY and the computer 17 thereby recognizes operational readiness, acknowledging it by switching over the signal ENI from a logical value "0" to a logical value "1". At the same time it switches the clocking impulse of the signal SCK over to the conductor 20. The logical value "1" of the signal ENI resets the D flip flop 97 back to zero via the gates 93, 95, and 96 causing the signal RDY to go also to zero. Thereby an impulse sequence of frequency 4 Hz exists. Slightly delayed by a period $\Delta t3$, a logical value "1" appears at the output of the time delay element 105 which enables the AND gate 80 via the OR gate 79 so that the clocking signal SCK reaches the clocking input of the serial/parallel converter 14. For this purpose the signal ENI resets the time delay element 110 via the inverter 102 or the OR gate 104 back to zero, causing the commutator 81 to be switched over and the clocking signal SCK to be switched to the AND gate 80. The clocking signal SCK shifts the bits stored in the serial/parallel converter 14 time-serially out of the latter and towards the output OUT of the arrangement according to the invention. When all the bits have been pushed out, e.g., after 240 ms, the computer 17 switches the signal SCK to the constant logical value "1" and the signal ENI to the logical value zero. Switching the signal ENI to zero causes the time delay element 105 to be set back to zero via the inverter 102 and the NOR gate 103, so that the signal CE3 reaches the AND gate 80 via the OR gate 79. At the same time the signal ENI enables the time delay element 110 again via inverter 102 and the OR gate 104 so that the clocking signal CLK is able to load the logical value "1" which reaches the QB output of the time delay element 110 in inverted form and delayed by the period $\Delta t2$. This causes the commutator 81 to be switched back so that the clocking signal CLK reaches the AND gate 80 in order to feed the serial/parallel converter 14 during the duration of the impulse of the 4 Hz signal CE3. As a consequence, during this time the bit values which represent the found power values are pushed out time-serially from the digital filter 9 and into the serial/parallel converter 14. In short: during normal operation of the modified second variant a certain predetermined bit value, i.e., the logical value "1" of the bit UPI is stored in the non-volatile memory 11. In operation the internal clocking signal CLK or alternately in time the interface clocking signal SCK emitted by the computer 17 is transmitted to the clocking input of the serial/parallel converter 14 for the purpose of sliding a digital power value in a time-serial manner from the analog-to-digital converter 2 into the serial/parallel converter 14 or the digital power value stored therein from the serial/parallel converter 14 into the computer 17. Following this sliding into the serial/parallel converter 14 an operational ready signal RDY transmitted to the computer 17 is available and is followed in time by two signals SCK and ENI transmitted by the computer 17 intermittently over separate conductors 20 and 19. Reception of the signal ENI in the arrangement according to the invention results in a termination of the operational ready signal RDY and a switching over of the clocking input of the serial/parallel converter 14 from the internal clocking signal CLK to the interface clocking signal SCK.

During the test mode of the modified second variant the computer 17 is connected via conductors 18 to 21 to the arrangement according to the invention and the output OUT of the latter goes via an additional conductor to an input of the former. In the beginning the signal ENI is equal to zero, so that the components 62, 67, 72, 84, 86, 94, and 106 are set back to zero. The signal SCK has at that moment a permanent logical value "1". At the beginning of the test mode a logical value "1" of the bit TUPI must be stored in the auxiliary memory 72 in that the computer 17 switches the signal ENI to logical value "1" and the transmission of the signal MOSI and of the clocking impulses of the signal SCK begins at the same time. The third bit TUPI of the signal MOSI has a logical value "1". Once the signal MOSI has been pushed into the shift register 62, the logical value "1" appearing at the Q output of the D flip flop 86 loads the logical value "1" of the bit TUPI from the shift register 62 into the pertaining memory cell of the auxiliary memory 72. This causes the signals TM3 and TMN14 to assume a logical value "1" and the signal TM3B to assume a logical value "0". The signals TM13 and TM13B on the other hand keep their logical value "0" or "1". By contrast with the programming mode of the second variant, although a logical value "1" is loaded into the D flip flop 86 with the 32nd falling flank of the clocking signal SCK, the computer 17 however then switches the clocking signal SCK over to the permanent logical value "1" following the 32nd rising flank. The counter 84 is set back to zero by the QB output signal of the D flip flop 86, but the logical value "0" then appearing at its Q output is not yet loaded into the D flip flop 86. The latter thus retains for the time being its logical value "1" instead of producing the falling flank of an impulse. The appearance of the logical value "1" of the signal TM3 produces a logical value "0" at the outputs of gates 111 and 112, said logical value "0" resetting the digital filter 9, the serial/parallel converter 14, the arrangement 10 and the impulse generator 73 to zero. With the 32nd rising flank of the clocking signal SCK the D flip flop 106 is then set, so that a logical value "1" appears at the output of the gates 111 and 112 cancelling the resetting of the components 9, 10, 14, and 73 so that these are again ready for reception and in operation. The logical value "1" at the Q output of the D flip flop 86 locks the AND gate 91 via the inverter 90. The outputs of the gates 109 and 104 then have a logical value "1" which cancels the resetting of the time delay element 110 so that there, slightly delayed by the time period Δt2, a logical value "1" is loaded by the clocking signal CLK so that the QB output of the time delay element 110 assumes a logical value logical value "0". The commutator 81 switches back so that the clocking signal CLK reaches the AND gate 80. The logical value "1" of the signal TM3 reaches the NOR gate 103 via the enabling AND gate 89 and the NOR gate 103 lays a logical value "0" at the reset input of the time delay element 105 causing the latter to be set back to zero and causing a logical value "0" to be placed at one of the inputs of the OR gate 79. As a result the 4 Hz signal CE3 at the other input of the latter becomes active and switches the clocking signal CLK to the clocking input of the serial/parallel converter 14 for the duration of its impulse. This has the result that the power value bits are pushed time-serially from the digital filter 9 into the serial/parallel converter 14. The logical value "1" at the Q output of the D flip flop 86 locks furthermore also the AND gate 92 via inverter 90 and since the AND gate 93 is also locked because of TM13, a logical value "1" which cancels the resetting of the D flip flop 97 appears at the output of the NOR gate 96 during the impulse gaps of the 4 Hz signal CE3, so that, since the signal TM14 has a logical value "1", the following positive flanks of the 4 Hz signal CLEB loads a logical value "1" into the D flip flop 97 and thereby switches it as signal RDY to the conductor 21 connected to the computer 17. The computer 17 thereby recognizes the readiness for operation of the arrangement according to the invention and acknowledges this by transmitting the clocking impulses of the clocking signal SCK again to the arrangement according to the invention. The first falling flank of the clocking signal SCK then loads the logical value "0" appearing at the Q output of the counter 84 into the D flip flop 86 causing a logical value "1" to appear at the output of gates 92 and 95 which switches the output of the NOR gate 96 to logical value "0" which then sets back the D flip flop 97 and thereby the signal RDY to zero. Furthermore a logical value "1" which sets back the time delay element 110 to zero via gates 109 and 104 appears at the AND gate 91 so that its QB output assumes a logical value "1" which switches over the commutator 81 so that the clocking signal SCK reaches the AND gate 80. In addition the AND gate 89 is now locked so that a logical value "1" appears at the reset input of the time delay element 105 and enables it so that a logical value "1" appears at the output of the time delay element 105 with a slight time delay of Δt3, said logical value "1" enabling the AND gate 80 via the OR gate 79 so that the clocking signal SCK reaches the clocking input of the serial/parallel converter 14. The clocking signal SCK then pushes for the first time the power value bits stored in the serial/parallel converter 14 during the test mode time serially out of same and to the output OUT of the arrangement according to the invention and thereby to the input of the computer 17 since a logical value "0" appears at the output of the NOR gate 76 because of the logical value "1" of the signal ENI, preventing the commutator 77 from being switched over and because furthermore the AND gate 71 is enabled because of the logical value "1" of the signal TM14. In other words: the components 1, 8, 9, 14, 60, 61, 69, 71, 76, 77, 79, 80, 81, 84 to 97, 102 to 105, and 110 are needed. In the test mode the output impulses of the arrangement according to the invention can thus not be calibrated within the latter but the calibration must take place in the computer 17. Since after 240 ms, for example, all the power value bits are pushed out, the computer 17 again switches the clocking signal SCK to the permanent logical value "1" at the 32nd rising flank and goes into waiting position until the next rising flank of the 4 Hz signal CLEB again produces a logical value "1" of the signal RDY by mens of the D flip flop 97, whereupon the described cycle is repeated. At the end of the latter, the power value bits are again, this time for the second time, pushed time-serially out of the serial/parallel converter 14 to the output OUT and thereby to the input of the computer 17. This cycle is subsequently repeated again and again until the computer 17 switches the signal ENI to zero in order to end the test mode, causing the shift register 62, the counter 84, and the D flip flops 67, 86, 94, and 106 to be set back to zero. Furthermore the signal ENI inverted in the inverter 102 loads zero values from the shift register 62 into the auxiliary memory 72 so that the latter and the signals TM3 and TM14 are set back to zero, deactivating the test mode. To sum up: in operation of the test mode of the modified second variant, after the storage of a certain predetermined bit value emitted by the computer 17, i.e., the logical value "1" of bit TUPI, the internal clocking signal CLK or alternately in time an interface clocking signal SCK emitted by the computer 17 is transmitted to a clocking input of the serial/parallel converter 14 for time-serial sliding of a digital power value from the analog-to-digital converter 2 into the serial/parallel converter 14 or of the digital power value stored therein from the serial/parallel converter 14 into the computer 17. After the sliding into the serial/parallel converter 14 an operational ready signal RDY transmitted to the computer 17 is available and is followed in time by the interface clocking signal SCK transmitted intermittently by the computer 17 over the separate conductor 20. Reception of the signal SCK in the arrangement according to the invention results in termination of the operational ready signal RDY and in commutation of the clocking input of the serial/parallel converter 14 from the internal clocking signal CLK to the interface clocking signal SCK.

In a control mode it is possible to test before a programming mode whether a calibration value $N_K$ calculated by the computer 17 is correct. For this purpose the latter is transmitted as part of the signal MOSI from the computer 17 via the communication interface 16 of the arrangement. The ninth bit TPRE of the signal MOSI has a logical value "1" while the bits TPRG, TRFP, and BTF each have a logic value zero. Before the control mode the signal ENI has a logical value "0" which resets the components 62, 72, 84, 86, and 210 to zero. The output signals TM1, TM2, and TM9 of the auxiliary memory are thereby all three zero. At the beginning of the control mode the computer 17 sets the signal ENI to logical value "1" causing the components 62, 86, and 210 to be enabled and the counting process of counter 84 to be started. The clocking signal SCK the shifts the signal MOSI into the shift register 62 where its bits are stored. When the signal MOSI has been pushed into the shift register 62, the impulse appearing at the Q output of the D flip flop 86 causes the calibration value $N_K$ stored in the shift register 62 to be stored in the auxiliary memory 203 and the values of bits TPRG, TRFP, and TPRE stored in the shift register 62 to be stored in their appertaining memory cells of the auxiliary memory 72 (see FIG. 11). Since the bits TPRG and TRFP each have a logical value "0" the signals TM1 and TM2 retain their logical value "0" while the signal TM0 assumes a logical value "1" which switches over the multi-bit switch 204 so that the calibration value $N_K$ stored in the auxiliary memory 203 reaches the commutated multi-bit switch 204 and the bus connection 206 the bus input 10a of the quantizer 10 whose output impulses are thus weighted with this calibration value $N_K$ or with the appertaining calibration constant $N'_K$ before they are transmitted for control purposes via the commutator 77 switched over by the signal TM9 over the OR gate 214 and via output OUT of the arrangement to the computer 17. The latter can thus initiate a new measurement to ascertain whether the used calibration value $N_K$ is correct and, if it is not, to correct it. In the latter case it can repeat the described control mode with corrected calibration value $N_K$ in order to ascertain whether it is now correct. At the end of each control mode the computer 17 again operates a general resetting by switching the signal ENI to zero so that among other things the contents of the auxiliary memory 203 are erased. The calculated and possibly corrected calibration value $N_K$ is thus only temporarily and only for control purposes stored in the auxiliary memory 203 and can then still be changed at any point in time.

At the end of the programming mode when all the logical values "1" of the calibration value $N_K$ are stored in the memory 11 a last possibility exists to control the correctness of the calibration value $N_K$ stored therein in a read mode and to correct it, if necessary, thereafter in at least one additional programming cycle by adding missing bit values "1". Erasure of the wrong bit values "1" is not possible since the appertaining diodes or Zener diodes have been destroyed. In the read mode the last ten bits belonging to the calibration value $N_K$ as well as the bits TPRG, TPRE, and BTF of the signal MOSI emitted b the computer 17 are all equal to zero while it second bit TRFP has a logical value "1". Before the read mode the signal ENI has again a logical value "0". The components 62, 72, 84, 86, 203, and 210 are accordingly reset to zero and the signals TM1, TM2 and TM9 are equal to zero. At the beginning of the read mode the computer 17 sets the signal ENI to logical value "1" causing the above-mentioned components which are set back to zero to be enabled and the counting process of the counter 84 to be started. When the signal MOSI is pushed into the sliding register 62, the impulse appearing at the Q output of the D flip flop 86 loads the bits TPRG, TRFP, and TPRE into their appertaining memory cells of the auxiliary memory 72. The signals TM1 and TM9 each retain their logical value "0" since the values of the bits TPRG and TPRE are zero. The commutator 77 does not commutate because the OR gate 214 has an output signal zero. Thus it is not the output of the impulse generator 73 but the Q output of the D flip flop 210 which is connected to the output OUT of the arrangement. Since the read bit TRFP has a logical value "1" the signal TM2 assumes a logical value "1" which enables the NAND gates 202 and 211 as well as the AND gate 212. At the output of the NAND gate 211 a negative impulse appears and causes the calibration value $N_K$ stored in the memory 11 to be loaded back in parallel into the ten last memory cells of the shift register 62 appearing on the left side in FIG. 11. The next clocking impulses of the interface clocking signal SCK the push the contents of the shift register 62 out beyond its serial output so that they reach the computer 17 via the D flip flop 210 and the output OUT of the arrangement, where they can be used for control purposes, e.g., to find correction values of the calibration value $N_K$ stored in the memory 11. The computer 17 ends the read mode by switching the signal ENI back to zero, causing the arrangement to be set back to zero.

If the calibration value $N_K$ stored in the memory 11 is considered correct after the programming and possible reading mode, it must be rendered irrevocably permanent so that it may not be changed later intentionally or unintentionally. For this purpose one single programming cycle is carried out in a programming closing mode in order to store a logical value "1" of the locking bit BTF in the memory 11. If the locking bit BTF had already been programmed to logical value "1" in a programming closing mode before the reading mode the reading mode can be used to control whether the arrangement in question is already permanently calibrated or not. In the programming closing mode the signal MOSI, the interface clocking signal SCK, the interface release signal ENI as well as the programming impulse PRG are transmitted by the computer 17 via the communication interface 16 to the arrangement once the calibration value $N_K$ or all pseudo-calibration values have been stored in the memory 11. In the programming closing mode the last ten bits belonging to the calibration value $N_K$ as well as the bits TRFP and TPRE of the signal MOSI transmitted by the computer 17 all have logical values "0" while the bits TPRG and BTF each have a logical value "1". Before the programming closing mode the signal ENI has a logical value "0" and the components 62, 72, 84, 86, 203, and 210 are set back to zero. All three signals TM1, TM2, and TM9 are thus zero. At the beginning of the programming closing mode the computer 17 sets the signal ENI to logical value "1" so that the components set back to zero are enabled and the counting process of the counter 84 is started.

When the signal MOSI is pushed into the shift register 62 the impulse which causes, via the OR gate 101, the bits TPRG, TRFP, and TPRE stored in the shift register 62 to be stored in their appertaining memory cells of the auxiliary memory 72 appears at the Q output of the D flip flop 86. Since the additional bit TPRG has a logical value "1" the signal TMI assumes a logical value "1" which releases the AND gate 207 (see FIG. 11). The signals TM2 and TM9 both retain their logical value "0" since the values of the bits TRFP and TPRE are zero. A brief programming impulse PRG of, e.g., 10 µs which is then transmitted by the computer 17 via conductor 21 reaches the programming input 64b of the programming enable arrangement 64 via the enabled gates 207 and 208 causing among other things its enable gate 64a appertaining to the locking bit BTF to be enabled for the duration of the programming impulse. This causes the memory cells of the memory 11 appertaining to the locking bit BTF to be programmed and a logical value "1" is stored or burned in therein. The locking bit BTF is thus stored into the memory 11 by means of the bit TPRG stored in the auxiliary memory 72 and of the programming impulse PRG. The locking bit BTF stored in the memory 11 is finally used in order to definitely prevent further loading of the memory 11 in that its logical value "1" locks the locking gate 208 forever via inverter 209. As a result no programming impulse PRG can ever reach the programming input 64b any more in the future and the contents of the memory 11 can thus no longer be changed. The computer 17 terminates the programming closing mode by resetting the signal ENI to zero so that the arrangement is set back to zero. When the arrangement has been permanently calibrated, i.e., when all of its locking bits BTF stored in its memory 11 have bit values "1", the arrangement to be calibrated can be removed from the calibration device and can be calibrated or, e.g., stored.

Part of the memory 11 can, in addition, be used to store additional information. These are, e.g., digitally adjustable or controllable parameters such as temperature coefficient compensation values and/or offset voltage equalization values, the latter, e.g., to take into account a load curve. They may however also be manufacturing indications such as, e.g., a production code, a production date and/or a production number. These data, separately or together, alone or in addition to the calibration value $N_K$ or to the pseudo-calibration values and the bits TPRG, TRFP, TUPI, TPRE, BTF, UPI, and DPW can be transmitted as signal MOSI by the computer 17 via the communication interface 16 to the arrangement and can be stored there in the memory 11.

Finally, the above described embodiments of the invention are intended to be illustrative only. Numerous alternative emobidments may be devised by those skilled in the art without departing from the spirit and scope of the following claims.

We claim:

1. A system for measuring energy, said system being calibrated and comprising:
   an analog power measurement circuit for receiving input signals, and for outputting analog power signals,
   an analog-to-digital converter for receiving said analog output power signals from said analog power measurement circuit, and for outputting digital signals representative of said analog output power signals, said analog-to-digital converter comprising a sigma-delta modulator in series with a digital filter,
   a digital quantizer for receiving said digital signals from said analog-to-digital converter at a first input, and
   a non-volatile memory, having inputs for receiving data from an external computer, and for outputting a digital first calibration value to said digital quantizer at a second input,
   wherein said digital quantizer accumulates said digital signals of said first input and quantizes said digital signals with respect to said digital first calibration value, such that said digital quantizer generates digitally quantized signals representative of said energy.

2. The system of claim 1 wherein said analog power measurement circuit and said sigma-delta modulator each have a polarity reverser circuit, the switch-over frequency of both of said polarity reversers being an integral multiple of a sampling frequency of said digital filter.

3. The system of claim 1 wherein said first calibration value is stored in said non-volatile memory.

4. The system of claim 1 wherein said first calibration value is a variable part of a second calibration value.

5. The system of claim 1 wherein said non-volatile memory is a programmable read only memory having a bus output which is connected to said second input of said digital quantizer.

6. The system of claim 1 wherein said digital quantizer and said non-volatile memory form an internal computer within said measuring system.

7. The system of claim 6 wherein said internal computer is a single computer common to a plurality of said measuring systems.

8. The system of claim 6 wherein said system further comprises a serial interface connected between the output of said analog-to-digital converter and the input of said internal computer.

9. The system of claim 6 wherein said system further comprises an output of said analog-to-digital converter being connected to said internal computer via a serial-parallel converter and a serial communication interface, said serial communication interface being connected to a serial output of said serial-parallel converter.

10. The system of claim 9 wherein a serial output of said analog-to-digital converter is connected to a serial input of said serial-parallel converter, and a parallel output of said serial-parallel converter is connected to said first input of said digital quantizer.

11. The system of claim 10 wherein said digital quantizer comprises:
   a first intermediate memory for receiving said output of said serial-parallel converter at said first input,
   a first multi-bit switch controlled by a first clock signal,
   an algebraic adder circuit with first and second bus inputs,
   a bit expansion circuit for receiving a bus output from said non-volatile memory,
   wherein said first clock signal causes said first multi-bit switch to periodically alternate a connection from said first bus input of said algebraic adder to a bus output of said first intermediate memory and to a bus output of said bit expansion circuit, and
   a second intermediate memory for receiving a bus output from said algebraic adder, said second intermediate memory having an output bus connected to said second bus input of said algebraic adder.

12. The system of claim 11 wherein said digital quantizer further comprises:
   an enable gate for receiving a second clock signal, wherein when said first bus input of said algebraic adder is connected to said bus output of said first intermediate memory, an output value of said algebraic adder is loaded into said second intermediate memory by means of said enable gate and said second clock signal,
   a logic circuit arrangement wherein when said first input of said algebraic adder is connected to said bus output of said bit expansion circuit, said algebraic adder becomes an adding circuit if a negative value is stored in said first intermediate memory, and, conversely, said algebraic adder becomes a substracting circuit if a positive value is stored in said first intermediate memory,
   an impulse generator for receiving the most significant bit of said bus output of said first intermediate memory, and also the most significant bit of said output of said algebraic adder, wherein when said first bus input of said algebraic adder is connected to said bus output of said bit expansion circuit, and said most significant bits are identical, said impulse generator outputs an impulse signal representing a power measurement of said electrial energy source, and
   wherein said output of said impulse generator is further connected to a load input of said second intermediate memory.

13. The system of claim 1 wherein said digital filter comprises at least one filter stage having a transfer function of at least one of second order, in the form of $Sinc^K$, where $K \geq 2$.

14. The system of claim 13 wherein said digital filter comprises a series connection of a first $Sinc^2$-filter and a second $Sinc^2$-filter.

15. The system of claim 14 wherein each of said first $Sinc^2$-filter and said second $Sinc^2$-filter comprises a first digital integrator in series with a second digital integrator, said second digital integrator having a reset, wherein a decimation occurs at the output of said second digital integrator, said output of said second digital integrator being further connected to a digital differentiation element.

16. The system of claim 15 wherein said first $Sinc^2$-filter has 12 bits with a decimation factor value 32, and wherein said second $Sinc^2$-filter has 32 bits with a decimation factor value 1024.

17. The system of claim 9 wherein said non-volatile memory is programmable by an external computer via said serial communication interface.

18. The system of claim 17 wherein said serial communication interface comprises a receiver and memory for receiving bit values transmitted over a communication interface bus from said external computer, wherein said bit values comprise a code word and additional bits, and wherein said code word represents said first calibration value.

19. The system of claim 18 wherein said bit values transmitted by said external computer have the form of a time-serial signal, said time-serial signal being transmitted over a first conductor of said communication interface bus, and wherein said communication interface bus further comprises at least second, third, and fourth conductors, said second, third, and fourth conductors selectively carrying an interface clock signal, an interface enable signal, and a programming impulse signal, said signals being transmitted from said external computer, wherein said programming impulse signal stores said code word representing said first calibration value into said non-volatile memory, as enabled by one of said additional bits.

20. The system of claim 18 wherein said serial communication interface further comprises:

a shift register for time-serial storage of said bit values transmitted by said external computer, a programming enable circuit for retransmitting a first portion of said bit values stored in said shift register to said non-volatile memory for storage therein, and an auxiliary memory for storing a second portion of said bit values stored in said shift register.

21. The system of claim 20 wherein an output of said non-volatile memory corresponding to said first calibration value is connected to a parallel input of memory cells in said shift register for back-storage of said contents into said shift register, so that said contents can then be transmitted to said external computer for display.

22. The system of claim 20 wherein said programming enable circuit comprises a plurality of enable gates, wherein one of said enable gates stores a locking bit into a corresponding memory cell of said non-volatile memory, said locking bit having been transmitted from said external computer via said shift register in said serial communication interface, and wherein an output of said corresponding memory cell of said non-volatile memory is connected to an input of a locking gate so as to lock the other said enable gates of said programming enable circuit.

23. The system of claim 20 further comprising an additional auxiliary memory and a second multi-bit switch, wherein parallel outputs of said shift register appertaining to said first calibration value are connected to a bus input of said additional auxiliary memory, and wherein said second multi-bit switch can switch a bus input of said digital quantizer from said bus output of said non-volatile memory to a bus output of said additional auxiliary memory.

24. The system of claim 17 wherein an output of said analog-to-digital converter is connected via said serial-parallel converter to an input of said external computer so that, when a second predetermined bit value is outputted by said external computer and stored in said shift register, a clock signal is selectively outputted from said external computer, hereinafter designated as an interface clock signal, and from said internal computer, hereinafter designated as an internal clock signal, to a clock input of said serial-parallel converter in timely alternation, such that digital power values from said analog-to-digital converter are alternately time-serial shifted from said analog-to-digital converter into said serial-parallel converter, and said digital power values stored therein from said serial-parallel converter into said external computer.

25. The system of claim 24 wherein after shifting said digital power values into said serial-parallel converter, a second ready signal is sent to said external computer, said external computer then outputting said interface clock signal over a separate conductor from said second ready signal, wherein a reception of said interface clock signal terminates said second ready signal and switches over said clock input of said serial-parallel converter from said internal clock signal to said interface clock signal.

26. The system of claim 17 wherein an output of said analog-to-digital converter is connected via a serial-parallel converter to an input of said external computer, wherein a first predetermined bit value is stored in said non-volatile memory, and wherein, alternating in time, an interface clock signal outputted by said external computer, and an internal clock signal are transmitted to a clock input of said serial-parallel converter for time-serial shifting of said digital signals from said analog-to-digital converter into said serial-parallel converter, and for time-serial shifting said digital signals stored therein from said serial-parallel converter into said external computer.

27. The system of claim 26 wherein after shifting said digital signals into said serial-parallel converter, a first ready signal is sent to said external computer, said external computer then outputting said interface clock signal and an interface enable signal over separate conductors from said first ready signal, wherein a reception of said interface enable signal terminates said first ready signal and switches over said clock input of said serial-parallel converter from said internal clock signal to said interface clock signal.

* * * * *